United States Patent
Nishikawa et al.

(10) Patent No.: US 12,196,995 B2
(45) Date of Patent: Jan. 14, 2025

(54) LAMINATE, CIRCULARLY POLARIZING PLATE, AND DISPLAY DEVICE

(71) Applicant: FUJIFILM Corporation, Tokyo (JP)

(72) Inventors: Hideyuki Nishikawa, Kanagawa (JP); Makoto Kamo, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 614 days.

(21) Appl. No.: 17/411,553

(22) Filed: Aug. 25, 2021

(65) Prior Publication Data
US 2021/0389515 A1 Dec. 16, 2021

Related U.S. Application Data

(63) Continuation of application No. PCT/JP2020/007680, filed on Feb. 26, 2020.

(30) Foreign Application Priority Data

Feb. 27, 2019 (JP) .................. 2019-034818

(51) Int. Cl.
*G02B 5/30* (2006.01)
*G02F 1/1335* (2006.01)

(52) U.S. Cl.
CPC ......... *G02B 5/3083* (2013.01); *G02B 5/3016* (2013.01); *G02F 1/133541* (2021.01)

(58) Field of Classification Search
CPC ... G02B 5/30; G02B 5/20; G02B 5/22; G02B 5/3083; G02B 5/3025; G02B 5/3016;
(Continued)

(56) References Cited

U.S. PATENT DOCUMENTS

| | | | |
|---|---|---|---|
| 2002/0005925 A1* | 1/2002 | Arakawa | G02B 5/3083 349/117 |
| 2007/0153178 A1 | 7/2007 | Rao et al. | |
| 2010/0045901 A1 | 2/2010 | Uehira et al. | |

FOREIGN PATENT DOCUMENTS

| | | |
|---|---|---|
| JP | 2000-314885 A | 11/2000 |
| JP | 2001-208913 A | 8/2001 |

(Continued)

OTHER PUBLICATIONS

Office Action, which was issued by the Japanese Patent Office on Jul. 5, 2022, in connection with Japanese Patent Application No. 2021-502310.

(Continued)

*Primary Examiner* — Jie Lei
(74) *Attorney, Agent, or Firm* — Edwards Neils LLC; Jean C. Edwards, Esq.

(57) ABSTRACT

Provided is a laminate exhibiting excellent reverse wavelength dispersibility, a circularly polarizing plate, and a display device. The laminate includes a first optically anisotropic film and a second optically anisotropic film, in which both of the first optically anisotropic film and the second optically anisotropic film have a slow axis in an in-plane direction, a maximum absorbance X in a wavelength range of 700 to 900 nm in a slow axis direction and a maximum absorbance Y in a wavelength range of 700 to 900 nm in a fast axis direction of the first optically anisotropic film are different from each other, and the slow axis of the first optically anisotropic film and the slow axis of the second optically anisotropic film are parallel with or perpendicular to each other.

11 Claims, 5 Drawing Sheets

(58) Field of Classification Search
CPC ... G02B 5/208; G02F 1/1335; G02F 1/13363; G02F 1/133541; G02F 1/133637; H10K 50/00; H10K 59/00; H10K 50/86; H10K 59/8791; B32B 7/023; B32B 27/18; G09F 9/00; G09F 9/30; H05B 33/02; H05B 33/14
USPC ............ 359/483.01, 484.05, 489.01, 489.06, 359/489.11, 489.15, 492.01
See application file for complete search history.

(56) References Cited

FOREIGN PATENT DOCUMENTS

| | | |
|---|---|---|
| JP | 2004-325971 A | 11/2004 |
| JP | 2008-273925 A | 11/2008 |
| JP | 2009-520239 A | 5/2009 |
| JP | 2013-001042 A | 1/2013 |
| JP | 2016-139058 A | 8/2016 |

OTHER PUBLICATIONS

International Search Report issued in PCT/JP2020/007680 on May 19, 2020.
Written Opinion issued in PCT/JP2020/007680 on May 19, 2020.
International Preliminary Report on Patentability completed by WIPO on Aug. 25, 2021 in connection with International Patent Application No. PCT/JP2020/007680.

* cited by examiner

LAMINATE, CIRCULARLY POLARIZING PLATE, AND DISPLAY DEVICE

CROSS-REFERENCE TO RELATED APPLICATIONS

This application is a Continuation of PCT International Application No. PCT/JP2020/007680 filed on Feb. 26, 2020, which was published under PCT Article 21 (2) in Japanese, and which claims priority under 35 U.S.C. § 119 (a) to Japanese Patent Application No. 2019-034818 filed on Feb. 27, 2019. The above applications are hereby expressly incorporated by reference, in their entirety, into the present application.

BACKGROUND OF THE INVENTION

1. Field of the Invention

The present invention relates to a laminate, a circularly polarizing plate, and a display device.

2. Description of the Related Art

A phase difference film having refractive index anisotropy (optically anisotropic film) has been applied to various uses such as an antireflection film of a display device, and an optical compensation film of a liquid crystal display device.

In recent years, an optically anisotropic film exhibiting reverse wavelength dispersibility has been studied (JP2008-273925A). In addition, the reverse wavelength dispersibility means "negative dispersion" characteristics showing an increase in a birefringence in accordance with an increase in a measurement wavelength in at least a part of a wavelength range in the visible region.

SUMMARY OF THE INVENTION

On the other hand, a reverse wavelength dispersibility exhibited by optically anisotropic films in the related art has not necessarily been sufficient, and accordingly, a further improvement has been required.

More specifically, in a case of taking an example in which a λ/4 plate (1/4 wavelength plate) is used as an optically anisotropic film, it is ideal that an in-plane phase difference in the visible region is a 1/4 wavelength of a measurement wavelength. However, in optically anisotropic films in the related art, there is a tendency that a deviation from an ideal curve appears on a long wavelength side in the visible region. Furthermore, in the present specification, the optical characteristics (in-plane phase difference) which are closer to the ideal curve are meant to indicate that the reverse wavelength dispersibility is excellent.

Taking the circumstances into consideration, the present invention has an object to provide a laminate exhibiting excellent reverse wavelength dispersibility.

In addition, the present invention has another object to provide a circularly polarizing plate and a display device.

The present inventors have conducted intensive studies on problems in the related art, and as a result, they have found that the objects can be accomplished by the following configurations.

(1) A laminate comprising:
a first optically anisotropic film; and
a second optically anisotropic film,
in which both of the first optically anisotropic film and the second optically anisotropic film have a slow axis in an in-plane direction,
a maximum absorbance X in a wavelength range of 700 to 900 nm in a slow axis direction and a maximum absorbance Y in a wavelength range of 700 to 900 nm in a fast axis direction of the first optically anisotropic film are different from each other, and
the slow axis of the first optically anisotropic film and the slow axis of the second optically anisotropic film are parallel with or perpendicular to each other.

(2) The laminate as described in (1),
in which the maximum absorbance X is larger than the maximum absorbance Y,
the slow axis of the first optically anisotropic film and the slow axis of the second optically anisotropic film are perpendicular to each other,
an in-plane retardation of the second optically anisotropic film at a wavelength of 550 nm is larger than an in-plane retardation of the first optically anisotropic film at a wavelength of 550 nm,
the first optically isotropic film satisfies Requirement 1 which will be described later, and
the first optically anisotropic film and the second optically anisotropic film satisfy Requirement 2 and Requirement 3 which will be described later.

(3) The laminate as described in (1),
in which the maximum absorbance Y is larger than the maximum absorbance X,
the slow axis of the first optically anisotropic film and the slow axis of the second optically anisotropic film are perpendicular to each other,
an in-plane retardation of the second optically anisotropic film at a wavelength of 550 nm is smaller than an in-plane retardation of the first optically anisotropic film at a wavelength of 550 nm,
the first optically anisotropic film satisfies Requirements 4 and 5 which will be described later, and
the first optically anisotropic film and the second optically anisotropic film satisfy Requirements 6 and 7 which will be described later.

(4) The laminate as described in (1),
in which the maximum absorbance Y is larger than the maximum absorbance X,
the slow axis of the first optically anisotropic film and the slow axis of the second optically anisotropic film are parallel with each other,
the first optically anisotropic film satisfies Requirements 4 and 5 which will be described later, and
the second optically anisotropic film satisfies Requirements 8 and 9 which will be described later.

(5) The laminate as described in any one of (1) to (4),
in which the first optically anisotropic film includes a polymer having a residue derived from an infrared absorbing coloring agent or an infrared absorbing coloring agent.

(6) The laminate as described in any one of (1) to (5),
in which the first optically anisotropic film is an optically anisotropic film formed of a composition including a liquid crystal compound and an infrared absorbing coloring agent.

(7) The laminate as described in any one of (1) to (5),
in which the first optically anisotropic film is a stretched film including a polymer and an infrared absorbing coloring agent.

(8) The laminate as described in any one of (1) to (7),
in which an in-plane retardation at a wavelength of 550 nm is 110 to 160 nm.

(9) A circularly polarizing plate comprising:
the laminate as described in (8); and
a polarizer.
(10) A display device comprising:
a display element; and
the circularly polarizing plate as described in (9), arranged on the display element,
(11) An optically anisotropic film satisfying Requirement 10 which will be described later,
in which a maximum absorbance in a wavelength range of 700 to 900 nm in a fast axis direction of the optically anisotropic film is larger than a maximum absorbance in a wavelength range of 700 to 900 nm in a slow axis direction of the optically anisotropic film.
(12) An optically anisotropic film satisfying Requirement 11 which will be described later,
in which a maximum absorbance in a wavelength range of 700 to 900 nm in a fast axis direction of the optically anisotropic film is smaller than a maximum absorbance in a wavelength range of 700 to 900 nm in a slow axis direction of the optically anisotropic film.

According to the present invention, it is possible to provide a laminate exhibiting excellent reverse wavelength dispersibility.

In addition, according to the present invention, it is also possible to provide a circularly polarizing plate and a display device.

DESCRIPTION OF THE PREFERRED EMBODIMENTS

Figure 1:
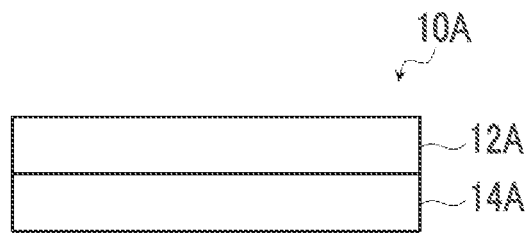
FIG. 1 is a cross-sectional view of a first embodiment of the laminate.

Hereinafter, the present invention will be described in detail. Furthermore, in the present specification, a numerical range expressed using "to" means a range that includes the preceding and succeeding numerical values of "to" as the lower limit value and the upper limit value, respectively. First, terms used in the present specification will be described. In addition, a fast axis and a slow axis are each defined at 550 nm unless otherwise specified.

In the present invention, $Re(\lambda)$ and $Rth(\lambda)$ represent an in-plane retardation and a thickness-direction retardation at a wavelength of $\lambda$, respectively. The wavelength of $\lambda$ refers to 550 nm unless otherwise specified.

In the present invention, $Re(\lambda)$ and $Rth(\lambda)$ are values measured at a wavelength of $\lambda$ in AxoScan OPMF-1 (manufactured by Opto Science, Inc.). By inputting an average refractive index $((nx+ny+nz)/3)$ and a film thickness (d (μm)) to AxoScan, the values can be calculated:

Slow axis direction (°)
$Re(\lambda)=R0(\lambda)$
$Rth(\lambda)=((nx+ny)/2-nz) \times d$.

Furthermore, $R0(\lambda)$ is expressed in a numerical value calculated with AxoScan OPMF-1, but means $Re(\lambda)$.

In the present specification, the refractive indices, nx, ny, and nz are measured with an Abbe refractometer (NAR-4T, manufactured by Atago Co., Ltd.), using a sodium lamp ($\lambda$=589 nm) as a light source. In addition, in a case where a wavelength dependency is measured, the wavelength dependency can be measured with a multi-wavelength Abbe refractometer DR-M2 (Manufactured by Atago Co., Ltd.) in combination with an interference filter.

Moreover, the values mentioned in Polymer Handbook (JOHN WILEY & SONS, INC.) and the catalogues of various optical films can be used. The values of the average refractive indices of major optical films are exemplified below: cellulose acylate (1.48), cycloolefin polymer (1.52), polycarbonate (1.59), polymethyl methacrylate (1.49), and polystyrene (1.59).

Moreover, in the present specification, "visible rays" are intended to mean a light at a wavelength of 400 nm or more and less than 700 nm. Further, "infrared rays" are intended to mean light at a wavelength of 700 nm or more, "near-infrared rays" are intended to mean light at a wavelength from 700 nm to 2,000 nm, and "ultraviolet rays" are intended to mean light at a wavelength of 10 nm or more and less than 400 nm.

In addition, in the present specification, angles (for example, an angle of "90°") and a relationship thereof (for example, "perpendicular" and "parallel") include a range of errors tolerable in the technical field to which the present invention belongs. For example, the angle means an angle in a range of less than ±10° of a rigorous angle, and the error from the rigorous angle is preferably 5° or less, and more preferably 3° or less.

The bonding direction of a divalent group (for example, —O—CO—) as noted in the present specification is not particularly limited, and for example, in a case where in the group represented by X-L-Y, L is —O—CO—, and *1 and *2 represent a bonding position to the X side and a bonding position to the Y side, respectively, L may be either *1-O—CO-*2 or *1-CO—O-*2.

Hereinafter, a configuration of the laminate will be described in detail.

Furthermore, in the description of the configuration of the laminate, each of embodiments will be described.

Embodiment 1

A first embodiment of the laminate may be a laminate including a first optically anisotropic film and a second optically anisotropic film, in which both of the first optically anisotropic film and the second optically anisotropic film have a slow axis in an in-plane direction, a maximum absorbance X in a wavelength range of 700 to 900 nm in a slow axis direction is larger than a maximum absorbance Y in a wavelength range of 700 to 900 nm in a fast axis direction of the first optically anisotropic film, the slow axis of the first optically anisotropic film and the slow axis of the second optically anisotropic film are perpendicular to each other, and an in-plane retardation Re2(550) of the second optically anisotropic film at a wavelength of 550 nm is larger than an in-plane retardation Re1(550) of the first optically anisotropic film at a wavelength of 550 nm, the first optically anisotropic film satisfies Requirement 1 which will be described later, and the first optically anisotropic film and the second optically anisotropic film satisfy Requirement 2 and Requirement 3 which will be described later.

Hereinafter, the first embodiment will be described with reference to the drawings.

Figure 2:
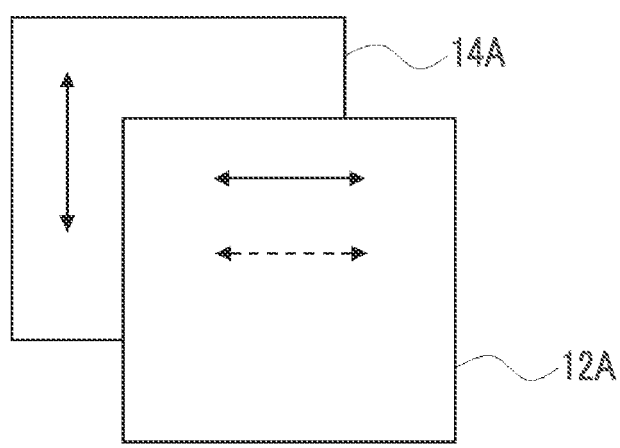
FIG. 2 is a view showing a relationship between a slow axis and an absorption at a wavelength of 700 to 900 nm of an optically anisotropic film in the first embodiment of the laminate.

FIG. 1 is a cross-sectional view of a first embodiment of the laminate. FIG. 2 is a view showing a relationship between a slow axis and an absorption at a wavelength of 700 to 900 nm of an optically anisotropic film in the first embodiment of the laminate.

A laminate 10A includes a first optically anisotropic film 12A and a second optically anisotropic film 14A.

In FIG. 2, the slow axis in an in-plane direction (in-plane slow axis) of the first optically anisotropic film 12A and the slow axis in an in-plane direction of the second optically anisotropic film 14A are indicated by solid arrows. As shown in FIG. 2, the slow axis of the first optically anisotropic film 12A and the slow axis of the second optically anisotropic film 14A are perpendicular to each other.

In the laminate 10A, the maximum absorbance X in a wavelength range of 700 to 900 nm in the slow axis direction of the first optically anisotropic film 12A is larger than the maximum absorbance Y in a wavelength range of 700 to 900 nm in the fast axis direction. That is, in a case where the maximum absorbances in a wavelength range of 700 to 900 nm in the slow axis direction and the fast axis direction of the first optically anisotropic film 12A are compared, the maximum absorbance in a direction parallel with the slow axis direction of the first optically anisotropic film 12A is larger, as indicated by an arrow of a broken line in FIG. 2.

An expression, "the maximum absorbance X in a wavelength range of 700 to 900 nm in the slow axis direction of the first optically anisotropic film 12A is larger than the maximum absorbance Y in a wavelength range of 700 to 900 nm in the fast axis direction", is intended to mean that the maximum absorbance in a wavelength range of 700 to 900 nm of an absorption spectrum obtained upon irradiation of the first optically anisotropic film 12A with polarized light in parallel with the slow axis of the first optically anisotropic film 12A is larger than the maximum absorbance in a wavelength range of 700 to 900 nm of an absorption spectrum obtained upon irradiation of the first optically anisotropic film 12A with polarized light in parallel with the fast axis of the first optically anisotropic film 12A.

In addition, the measurement can be carried out using a spectrophotometer (MPC-3100 manufactured by SHIMADZU Corporation) equipped with a polarizer for infrared rays.

In addition, the in-plane retardation (Re2(550)) of the second optically anisotropic film 14A at a wavelength of 550 nm is larger than the in-plane retardation (Re1(550)) of the first optically anisotropic film 12A at a wavelength of 550 nm.

A difference (Re2(550)−Re1(550)) between Re2(550) and Re1(550) is not particularly limited, but can be appropriately set according to a desired value since the in-plane retardation of the obtained laminate 10A corresponds to the difference as will be described later.

For example, in a case where the laminate 10A is used as a λ/4 plate, the difference is preferably 110 to 160 nm, and more preferably 120 to 150 nm.

The range of Re1(550) is not particularly limited, but is preferably 20 to 400 nm, and more preferably 30 to 200 nm from the viewpoint that a laminate exhibiting more excellent reverse wavelength dispersibility can be obtained (hereinafter also simply referred to as "the viewpoint where the effect of the present invention is more excellent").

The range of Re2(550) is not particularly limited, but is preferably 100 to 500 nm, and more preferably 180 to 300 nm from the viewpoint that the effect of the present invention is more excellent.

The first optically anisotropic film 12A satisfies Requirement 1.

{Re1(650)/Re1(550)}<0.95     Requirement 1:

Re1(550) represents an in-plane retardation of the first optically anisotropic film 12A at a wavelength of 550 nm, and Re1(650) represents an in-plane retardation of the first optically anisotropic film 12A at a wavelength of 650 nm.

{Re1(650)/Re1(550)} only needs to satisfy Requirement 1 above and Requirement 3 which will be described later, but is preferably 0.92 or less, and more preferably 0.85 or less from the viewpoint that the effect of the present invention is more excellent. A lower limit thereof is not particularly limited, but is preferably 0.50 or more, and more preferably 0.60 or more.

The first optically anisotropic film 12A and the second optically anisotropic film 14A each satisfy Requirement 2 and Requirement 3. That is, the laminate 10A satisfies Requirement 2 and Requirement 3.

{Re1(450)/Re1(550)}>{Re2(450)/Re2(550)}     Requirement 2:

{Re1(650)/Re1(550)}<{Re2(650)/Re2(550)}     Requirement 3:

Re1(450) represents an in-plane retardation of the first optically anisotropic film 12A at a wavelength of 450 nm.

Re2(450) represents an in-plane retardation of the second optically anisotropic film 14A at a wavelength of 450 nm, Re2(550) represents an in-plane retardation of the second optically anisotropic film 14A at a wavelength of 550 nm, and Re2(650) represents an in-plane retardation of the second optically anisotropic film 14A at a wavelength of 650 nm.

Above all, it is preferable that the first optically anisotropic film 12A and the second optically anisotropic film 14A each satisfy Requirement 2-1 and Requirement 3-1 from the viewpoint that a more general-purpose material can be used as the second optically anisotropic film 14A. That is, it is preferable that the laminate 10A satisfies Requirement 2-1 and Requirement 3-1.

{Re1(450)/Re1(550)}>{Re2(450)/Re2(550)}≧1.00   Requirement 2-1:

{Re1(650)/Re1(550)}<{Re2(650)/Re2(550)}<1.00   Requirement 3-1:

Re1(450) represents an in-plane retardation of the first optically anisotropic film 12A at a wavelength of 450 nm.

Requirement 2-1 represents that {Re1(450)/Re1(550)} is larger than {Re2(450)/Re2(550)}, and is larger than 1.00. In addition, Requirement 2-1 represents that {Re2(450)/Re2(550)} is smaller than {Re1(450)/Re1(550)}, but is 1.00 or more.

Requirement 3-1 represents that {(Re1(650)/Re1(550)} is smaller than {Re2(650)/Re2(550)}, and is less than 1.0. In addition, Requirement 3-1 represents that {Re2(650)/Re2(550)} is larger than {Re1(650)/Re1(550)}, and is 1.00 or less.

{Re1(450)/Re1(550)} only needs to satisfy Requirement 2, but is preferably 1.05 to 1.40, and more preferably 1.08 to 1.30 from the viewpoint that the effect of the present invention is more excellent.

{Re2(450)/Re2(550)}, only needs to satisfy Requirement 2, but is preferably 1.00 to 1.15, and more preferably 1.01 to 1.10 from the viewpoint that the effect of the present invention is more excellent.

{Re2(650)/Re2(550)} only needs to satisfy Requirement 3, but is preferably 0.90 to 1.00, and more preferably 0.95 to 0.99 from the viewpoint that the effect of the present invention is more excellent.

A difference (Re2(450)−Re1(450)) between Re2(450) and Re1(450) is riot particularly limited, but it is preferable that Re2(450) is larger than Re1(450).

A difference (Re2(650)−Re1(650)) between Re2(650) and Re1(650) is not particularly limited, but it is preferable that Re2(650) is larger than Re1(650) from the viewpoint that the effect of the present invention is more excellent.

A reason why a predetermined effect can be obtained by the configuration is shown below.

Figure 3:
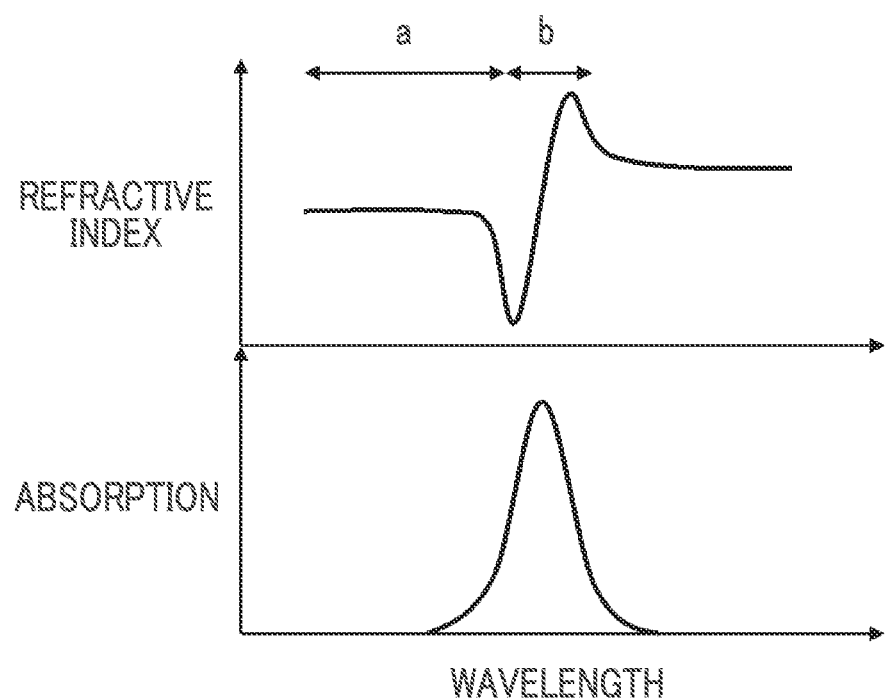
FIG. 3 is a view showing the wavelength dispersion characteristics with respect to a refractive index and an absorption coefficient of an organic molecule.

First, the refractive index wavelength dispersion characteristics of ordinary organic molecules will be described with reference to FIG. 3. In FIG. 3, the upper side shows the behavior of a refractive index with respect to a wavelength, and the lower side shows the behavior (absorption spectrum) of absorption characteristics with respect to the wavelength.

For the organic molecule, a refractive index n in a region (a region a in FIG. 3) away from the intrinsic absorption wavelength decreases monotonically as the wavelength increases. Such the dispersion is referred to as "normal dispersion". In contrast, a refractive index n in a wavelength band including an intrinsic absorption (a region b in FIG. 3) rapidly increases as the wavelength increases. Such the dispersion is referred to as "anomalous dispersion".

That is, as shown in FIG. 3, an increase or a decrease in the refractive index is observed immediately before the wavelength range having absorptions therein.

In the above-mentioned first optically anisotropic film 12A, the maximum absorbance in a wavelength range of 700 to 900 nm in the slow axis direction is larger than the maximum absorbance in a wavelength range of 700 to 900 nm in the fast axis direction. Hereinafter, such absorption characteristics are also referred to as absorption characteristics X. As described in detail later, it may be one of means for achieving the absorption characteristics X, for example, to arrange the axial direction having a high absorbance of the infrared absorbing coloring agent in the first optically anisotropic film 12A to be in parallel with the slow axis direction.

Hereinafter, the first optically anisotropic film exhibiting uniaxiality will be described as an example with respect to the absorption characteristics X. It should be noted that the first optically anisotropic film is not limited to uniaxiality.

In the optically anisotropic film exhibiting the absorption characteristics X, the extraordinary ray refractive index is further reduced, as compared with the optically anisotropic film not having absorption characteristics X.

Figure 4:
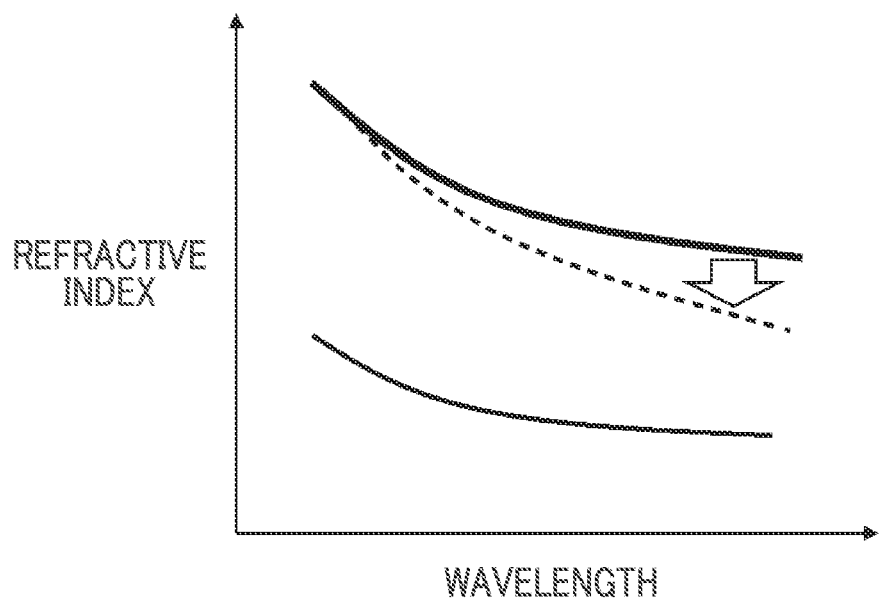
FIG. 4 is a view showing a comparison of the wavelength dispersion between an extraordinary ray refractive index ne and an ordinary ray refractive index no depending on the presence or absence of predetermined absorption characteristics.

Specifically, FIG. 4 is a view showing a comparison of the wavelength dispersion between an extraordinary ray refractive index ne and an ordinary ray refractive index no depending on the presence or absence of the absorption characteristics X. In FIG. 4, the thick line indicates a curve of the extraordinary ray refractive index ne in the absence of the absorption characteristics X, and the solid line indicates a curve of the ordinary ray refractive index no in the absence of the absorption characteristics X. In contrast, in the optically anisotropic film of the embodiment of the present invention, having the absorption characteristics X, a value of the extraordinary ray refractive index ne in the long wavelength range in the visible region is further reduced as indicated by a broken line under the influence derived from an absorption at a wavelength of 700 to 900 nm as shown in FIG. 4. As a result, a birefringence Δn which is a difference between the extraordinary ray refractive index ne and the ordinary ray refractive index no decreases in the long wavelength range in the visible region.

That is, in the first optically anisotropic film 12A having the absorption characteristics X, the in-plane retardation tends to decrease in the long wavelength range of the visible region.

Figure 5:
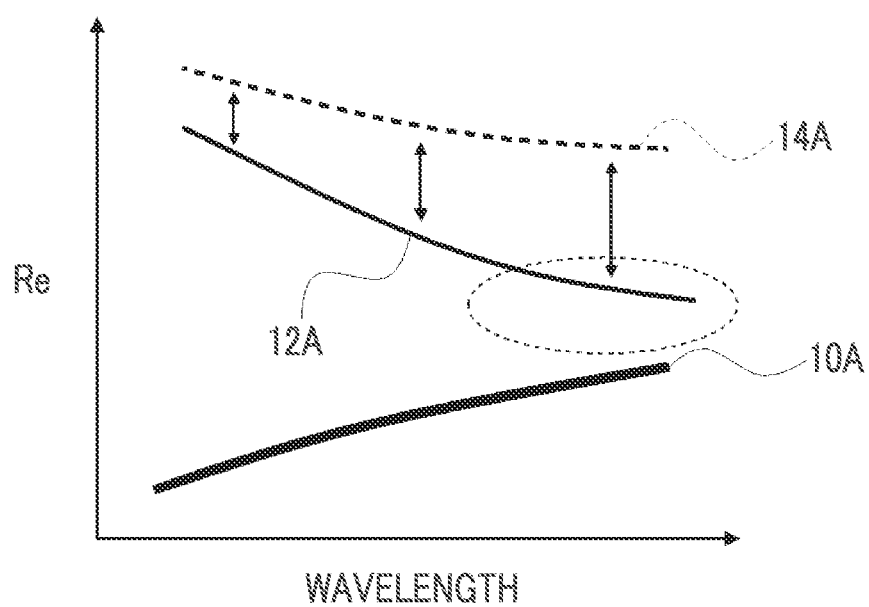
FIG. 5 is a view showing a relationship between an in-plane retardation of a first optically anisotropic film and an in-plane retardation of a second optically anisotropic film, and an in-plane retardation of a laminate.

Next, the relationship between the in-plane retardation of the first optically anisotropic film 12A and the in-plane retardation of the second optically anisotropic film 14A, and the in-plane retardation of the laminate 10A is shown in FIG. 5. The horizontal axis of FIG. 5 shows a wavelength (nm), and the vertical axis shows an in-plane retardation (Re) at each wavelength.

In FIG. 5, a broken line at the top indicates the in-plane retardation of the second optically anisotropic film 14A at each wavelength, a solid line in the middle indicates the in-plane retardation of the first optically anisotropic film 12A at each wavelength, and a thick line at the bottom indicates the in-plane retardation of the laminate 10A at each wavelength.

As mentioned above, in the laminate 10A, the slow axis of the first optically anisotropic film 12A and the slow axis of the second optically anisotropic film 14A are perpendicular to each other. In a case where the slow axes of the two optically anisotropic films are perpendicular to each other, the in-plane retardation of the laminate corresponds to a difference in the in-plane retardations of the two optically anisotropic films. That is, as indicated by an arrow in FIG. 5, the difference between the in-plane retardation of the first optically anisotropic film 12A at each wavelength and the in-plane retardation of the second optically anisotropic film 14A at each wavelength corresponds to the in-plane retardation of the laminate 10A at each wavelength.

As mentioned above, in the first optically anisotropic film 12A, the in-plane retardation in the long wavelength range decreases due to the influence of an absorption at a wavelength of 700 to 900 nm. Specifically, the in-plane retardation in the long wavelength range surrounded by a circle of a broken line in FIG. 5 decreases. Therefore, the difference between the in-plane retardation of the first optically anisotropic film 12A and the in-plane retardation of the second optically anisotropic film 14A in the long wavelength range increases, and as a result, the in-plane retardation of the laminate 10A in the long wavelength range increases.

Figure 6:
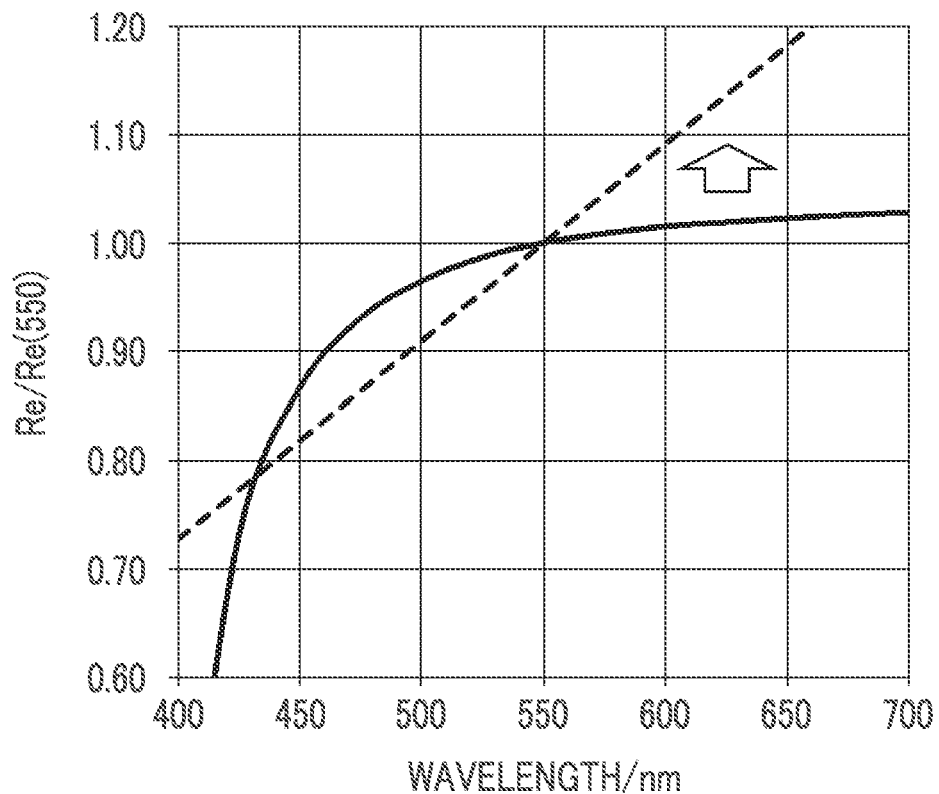
FIG. 6 is a view showing a comparison between the wavelength dispersion of an optically anisotropic film exhibiting reverse wavelength dispersibility in the related art and the wavelength dispersion of an ideal phase difference.

FIG. 6 shows the wavelength dispersion characteristics of a phase difference (Re(λ)) at each wavelength in the visible region with a phase difference (Re(550 nm)) at a measurement wavelength of 550 nm being normalized as 1. For example, the above-mentioned ideal λ/4 plate has "negative dispersion" characteristics in that a phase difference increase as a measurement wavelength increases since the phase difference is in a relationship in proportional with the measurement wavelength as indicated by a dotted line in FIG. 6. In contrast, with regard to an optically anisotropic film exhibiting reverse wavelength dispersibility in the related art, the wavelength dispersion characteristics are at positions overlapping an ideal curve indicated by a dotted line in the short wavelength range but often show a tendency to deviate from the ideal curve in the long, wavelength range, as indicated by a solid line in FIG. 6.

In contrast, in a case of adopting the configuration of the laminate 10A, the in-plane retardation in the long wavelength range increases, and thus, the optical characteristics in the long wavelength range can be closer to tile ideal curve, as indicated by an outlined arrow in FIG. 6.

The specific configurations of the first optically anisotropic film 12A and the second optically anisotropic film 14A will be described in detail later.

Re(450)/Re(550) of the laminate 10A is not particularly limited, but is preferably 0.65 to 0.96, and more preferably 0.75 to 0.95 from the viewpoint that the effect of the present invention is more excellent.

Re(650)/Re(550) of the laminate 10A is not particularly limited, but is preferably 1.07 to 1.25, and more preferably 1.10 to 1.20 from the viewpoint that the effect of the present invention is more excellent.

The laminate 10A may include members other than the first optically anisotropic film 12A and the second optically anisotropic film 14A.

For example, the laminate 10A may include an adhesive layer for ensuring the adhesiveness of the first optically anisotropic film 12A and the second optically anisotropic film 14A. The adhesive layer may be formed of known materials, and examples of the materials include known adhesives and pressure sensitive adhesives.

In addition, the laminate 10A may include a support.

Examples of the support include a plastic substrate and a glass substrate. Examples of a material constituting the plastic substrate include a polyester resin such as polyethylene terephthalate, a polycarbonate resin, a (meth)acryl resin, an epoxy resin, a polyurethane resin, a polyamide resin, a polyolefin resin, a cellulose derivative, a silicone resin, and polyvinyl alcohol.

As the support, a transparent support is preferable. In the present specification, in a case where the term "transparent" is used, specifically, the non-polarization transmittance (omnidirectional transmittance) at a wavelength of 380 to 780 nm only needs to be 50% or more, and is preferably 70% or more, and more preferably 85% or more.

The thickness of the support only needs to be about 5 to 1,000 μm, and is preferably 10 to 250 μm, and more preferably 15 to 90 μm.

The laminate 10A may include an alignment film.

The alignment film generally has a polymer as a main component. Polymers for an alignment film are described in many documents and a large number of commercially available products thereof can be obtained. The polymer to be used is preferably polyvinyl alcohol, polyimide, or a derivative thereof.

In addition, it is preferable that the alignment film is subjected to a known rubbing treatment.

The thickness of the alignment film is preferably 0.01 to 10 μm and more preferably 0.01 to 1 μm.

A method for producing the laminate 10A is not particularly limited, and examples thereof include a method of bonding each of the prepared first optically anisotropic film 12A and second optically anisotropic film 14A via an adhesive or a pressure sensitive adhesive.

Second Embodiment

A second embodiment of the laminate is a laminate including a first optically anisotropic film and a second optically anisotropic film, in which both of the first optically anisotropic film and the second optically anisotropic film have a slow axis in an in-plane direction, a maximum absorbance Y in a wavelength range of 700 to 900 nm in a fast axis direction is larger than a maximum absorbance X in a wavelength range of 700 to 900 nm in a stow axis direction of the first optically anisotropic film are different from each other, and the slow axis of the first optically anisotropic film and the slow axis of the second optically anisotropic film are perpendicular to each other, the in-plane retardation of the second optically anisotropic film at a wavelength of 550 nm is smaller than the in-plane retardation of the first optically anisotropic film at a wavelength of 550 nm, the first optically anisotropic film satisfies Requirements 4 and 5 which will be described later, and the first optically anisotropic film and the second optically anisotropic film satisfy Requirements 6 and 7 which will be described later.

Hereinafter, the second embodiment will be described with reference to the drawings.

Figure 7:
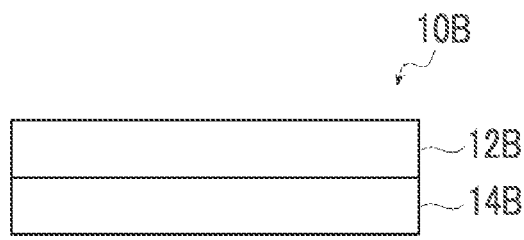
FIG. 7 is a cross-sectional view of a second embodiment of the laminate.
Figure 8:
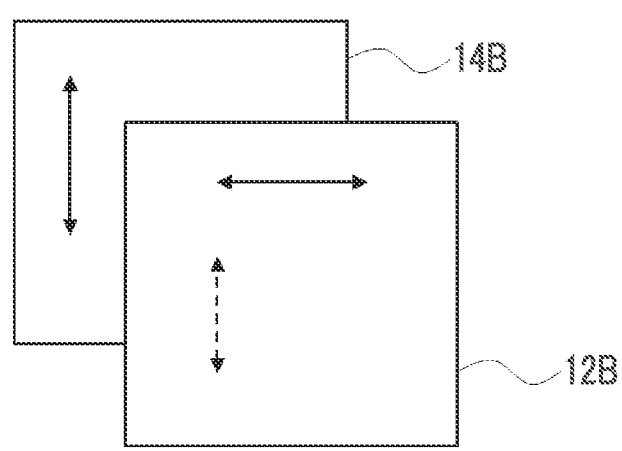
FIG. 8 is a view showing a relationship between a slow axis and an absorption at a wavelength of 700 to 900 nm of an optically anisotropic film in the second embodiment of the laminate.

FIG. 7 is a cross-sectional view of the second embodiment of the laminate. FIG. 8 is a view showing a relationship between a slow axis and an absorption at a wavelength of 700 to 900 nm of an optically anisotropic film in the second embodiment of the laminate.

A laminate 10B includes a first optically anisotropic film 12B and a second optically anisotropic film 14B.

In FIG. 8, the in-plane slow axis of the first optically anisotropic film 12B and the in-plane slow axis of the second optically anisotropic film 14B are each indicated by a solid arrow. As shown in FIG. 8, the slow axis of the first optically anisotropic film 12B and the slow axis of the second optically anisotropic film 14B are perpendicular to each other.

In the laminate 10B, the maximum absorbance Y in a wavelength range of 700 to 900 nm in the fast axis direction of the first optically anisotropic film 12B is larger than the maximum absorbance X in a wavelength range of 700 to 900 nm in the slow axis direction, That is, in a case where the maximum absorbances in a wavelength range of 700 to 900 nm in the slow axis direction and the fast axis direction of the first optically anisotropic film 12B are compared, the maximum absorbance in a direction parallel with the fast axis direction of the first optically anisotropic film 12B is larger, as indicated by an arrow of a broken line in FIG. 8.

An expression, "the maximum absorbance Y in a wavelength range of 700 to 900 nm in the fast axis direction of the first optically anisotropic film 12B is larger than the maximum absorbance X in a wavelength range of 700 to 900 nm in the slow axis direction", is intended to mean that the maximum absorbance in a wavelength range of 700 to 900 nm of an absorption spectrum obtained upon irradiation of the first optically anisotropic film 12B with polarized light in parallel with the fast axis of the first optically anisotropic film 12B is larger than the maximum absorbance in a wavelength range of 700 to 900 nm of an absorption spectrum obtained upon irradiation of the first optically anisotropic film 12B with polarized light in parallel with the slow axis of the first optically anisotropic film 12B.

In addition, the measurement can be carried out using a spectrophotometer (MPC-3100 manufactured by SHIMADZU Corporation) equipped with a polarizer for infrared rays.

In addition, the in-plane retardation (Re2(550)) of the second optically anisotropic film 14B at a wavelength of 550 nm is smaller than the in-plane retardation (Re1(550)) of the first optically anisotropic film 12B at a wavelength of 550 nm.

A difference (Re1(550)−Re2(550)) between Re1(550) and Re2(550) is not particularly limited, but since the in-plane retardation of the obtained laminate 10B corresponds to the difference as will be described later, the difference can be appropriately set according to a desired value.

For example, in a case where the laminate 10Bis used as a λ/4 plate, the difference is preferably 110 to 160 nm, and more preferably 120 to 150 nm.

The range of Re1(550) is not particularly limited, but is preferably 100 to 500 nm, and more preferably 180 to 300 nm from the viewpoint that the effect of the present invention is more excellent.

The range of Re2(550) is not particularly limited, but is preferably 20 to 400 nm, and more preferably 30 to 200 nm from the viewpoint that the effect of the present invention is more excellent.

The first optically anisotropic film 12B satisfies Requirements 4 and 5.

$\{Re1(450)/Re1(550)\} \geq 0.95$     Requirement 4:

$\{Re1(650)/Re1(550)\} \geq 1.02$     Requirement 5:

Re1(450) represents an in-plane retardation of the first optically anisotropic film 12B at a wavelength of 450 nm, Re1(550) represents an in-plane retardation of the first optically anisotropic film 12B at a wavelength of 550 nm, and Re1(650) represents an in-plane retardation of the first optically anisotropic film 12B at a wavelength of 650 nm.

$\{Re1(450)/Re1(550)\}$ only needs to satisfy Requirement 4, and Requirement 6 which will be described later, but is preferably 0.97 or more, and more preferably 1.00 or more from the viewpoint that the effect of the present invention is more excellent. An upper limit thereof is not particularly limited, but is preferably 1.20 or less, and more preferably 1.10 or less.

$\{Re1(650)/Re1(550)\}$ only needs to satisfy Requirement 5 and Requirement 7 which will be described later, but is preferably 1.03 or more, and more preferably 1.05 or more from the viewpoint that the effect of the present invention is more excellent. An upper limit thereof is not particularly limited, but is preferably 1.30 or less, and more preferably 1.20 or less.

The first optically anisotropic film 12B and the second optically anisotropic film 14B satisfy Requirement 6 and Requirement 7. That is, the laminate 10B satisfies Requirement 2 and Requirement 3.

$\{Re2(450)/Re2(550)\} > \{Re1(450)/Re1(550)\}$     Requirement 6:

$\{Re1(650)/Re1(550)\} > 1.00 \geq \{Re2(650)/Re2(550)\}$     Requirement 7:

Re2(450) represents an in-plane retardation of the second optically anisotropic film at a wavelength of 450 nm, Re2(550) represents an in-plane retardation of the second optically anisotropic film at a wavelength of 550 nm, and Re2(650) represents an in-plane retardation of the second optically anisotropic film at a wavelength of 650 nm.

Requirement 7 indicates that $\{Re1(650)/Re1(550)\}$ is larger than 1.00, and larger than $\{Re2(650)/Re2(550)\}$. In addition, Requirement 7 indicates that $\{Re2(650)/Re2(550)\}$ is smaller than $\{Re1(650)/Re1(550)\}$, and is 1.00 or less.

$\{Re2(450)/Re2(550)\}$ only needs to satisfy Requirement 6, but is preferably 1.05 to 1.40, and more preferably 1.08 to 1.30 from the viewpoint that the effect of the present invention is more excellent.

$\{Re2(650)/Re2(550)\}$ only needs to satisfy Requirement 7, but is preferably 0.80 to 1.00, and more preferably 0.90 to 0.97 from the viewpoint that the effect of the present invention is more excellent.

A difference between Re1(450) and Re2(450) (Re1(450)−Re2(450)) is not particularly limited, but it is preferable that Re1(450) is larger than Re2(450) from the viewpoint that the effect of the present invention is more excellent.

A difference (Re1(650)−Re2(650)) between Re1(650) and Re2(650) is not particularly limited, but it is preferable that Re1(650) is larger than Re2(650) from the viewpoint that the effect of the present invention is more excellent.

A reason why a predetermined effect can be obtained by the configuration is shown below.

In the above-mentioned first optically anisotropic film 12B, the maximum absorbance in a wavelength range of 700 to 900 nm in the fast axis direction is larger than the maximum absorbance in a wavelength range of 700 to 900 nm in the slow axis direction. Hereinafter, such absorption characteristics arc also referred to as absorption characteristics Y. As described in detail later, it may be one of means for achieving the absorption characteristics Y for example, to arrange the axial direction having a high absorbance of the infrared absorbing coloring agent in the first optically anisotropic film 12B to be in parallel with the fast axis direction.

Hereinafter, the first optically anisotropic film exhibiting uniaxiality will be described as an example with respect to the absorption characteristics Y. It should be noted that the first optically anisotropic film is not limited to uniaxiality.

In the optically anisotropic film exhibiting the absorption characteristics Y, the ordinary ray refractive index is further reduced, as compared with the optically anisotropic film not having absorption characteristics Y.

Figure 9:
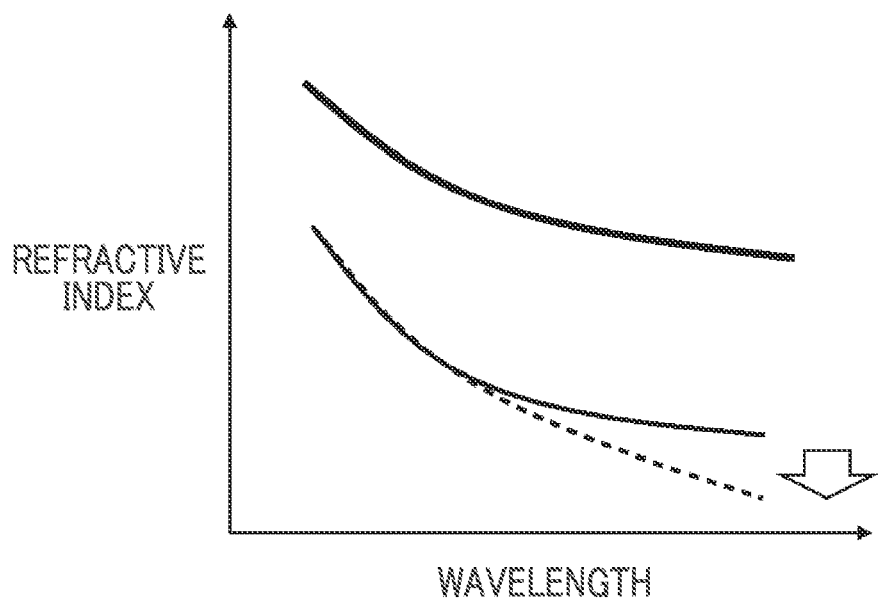
FIG. 9 is a view showing a comparison of the wavelength dispersion between an extraordinary ray refractive index ne and an ordinary ray refractive index no depending on the presence or absence of predetermined absorption characteristics.

Specifically, FIG. 9 is a view showing a comparison of the wavelength dispersion between an extraordinary ray refractive index ne and an ordinary ray refractive index no depending on the presence or absence of the absorption characteristics Y. In FIG. 9, the thick line indicates a curve of the extraordinary ray refractive index ne in the absence of the absorption characteristics Y and the solid line indicates a curve of the ordinary ray refractive index no in the absence of the absorption characteristics Y. In contrast, in the optically anisotropic film having the absorption characteristics Y, a value of the ordinary ray refractive index no in the long wavelength range in the visible region is further reduced as indicated by a broken line under the influence derived from an absorption at a wavelength of 700 to 900 nm. As a result, a birefringence Δn which is a difference between the extraordinary ray refractive index ne and the ordinary ray refractive index no increases in the long wavelength range in the visible region.

That is, in the first optically anisotropic film 12B having the absorption characteristics Y, the in-plane retardation tends to increase in the long wavelength range of the visible region.

Figure 10:
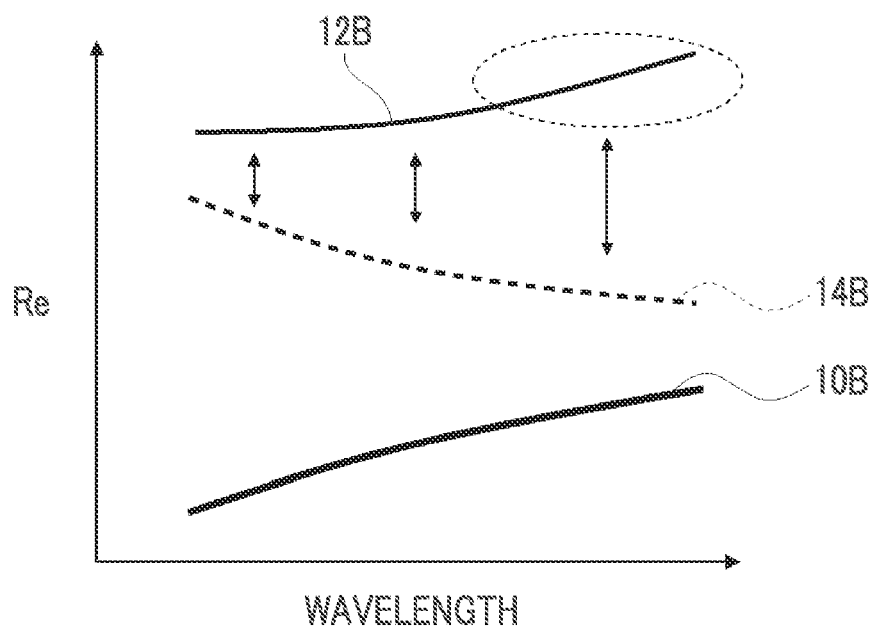
FIG. 10 is a view showing a relationship between an in-plane retardation of a first optically anisotropic film and an in-plane retardation of a second optically anisotropic film, and an in-plane retardation of a laminate.

Next, the relationship between the in-plane retardation of the first optically anisotropic film 12B and the in-plane retardation of the second optically anisotropic film 14B, and the in-plane retardation of the laminate 10B is shown in FIG. 10. The horizontal axis of FIG. 10 shows a wavelength (nm), and the vertical axis shows an in-plane retardation (Re) at each wavelength.

In FIG. 10, a solid line at the top indicates the in-plane retardation of the first optically anisotropic film 12B at each wavelength, a broken line in the middle indicates the in-plane retardation of the second optically anisotropic film 14B at each wavelength, and a thick line at the bottom indicates the in-plane retardation of the laminate 10B at each wavelength.

As mentioned above, in the laminate 10B, the slow axis of the first optically anisotropic film 12B and the slow axis of the second optically anisotropic film 14B are perpendicular to each other. In a case where the slow axes of the two optically anisotropic films are perpendicular to each other, the in-plane retardation of the laminate corresponds to a difference in the in-plane retardations of the two optically anisotropic films. That is, as indicated by an arrow in FIG. 10, the difference between the in-plane retardation of the first optically anisotropic film 12B at each wavelength and the in-plane retardation of the second optically anisotropic film 14B at each wavelength corresponds to the in-plane retardation of the laminate 10B at each wavelength.

As mentioned above, in the first optically anisotropic film 12B, the in-plane retardation in the long wavelength range increases due to the influence of an absorption at a wavelength of 700 to 900 nm. Specifically, the in-plane retardation in the long wavelength range surrounded by a circle of a broken line in FIG. 10 increases. Therefore, the difference between the in-plane retardation of the first optically anisotropic film 12B and the in-plane retardation of the second optically anisotropic film 14B in the long wavelength range increases, and as a result, the in-plane retardation of the laminate 10B in the long wavelength range increases.

As mentioned above, a reverse wavelength dispersible and optically anisotropic film in the related art often tends to deviate from the ideal curve in the long wavelength range.

In contrast, in a case of adopting the configuration of the laminate 10B, the in-plane retardation in the long wavelength range increases, and thus, the optical characteristics in the long wavelength range can be closer to the ideal curve, as indicated by an outlined arrow in FIG. 6.

The specific configurations of the first optically anisotropic film 12B and the second optically anisotropic film 14B will be described in detail later.

Re(450)/Re(550) of the laminate 10B is not particularly limited, but is preferably 0.65 to 0.96, and more preferably 0.75 to 0.93 from the viewpoint that the effect of the present invention is more excellent.

Re(650)/Re(550) of the laminate 10B is not particularly limited, but is preferably 1.07 to 1.25, and more preferably 1.10 to 1.20 from the viewpoint that the effect of the present invention is more excellent.

The laminate 10B may include members other than the first optically anisotropic film 12B and the second optically anisotropic film 14B.

For example, the laminate 10B may include an adhesive layer for ensuring the adhesiveness of the first optically anisotropic film 12B and the second optically anisotropic film 14B. The adhesive layer may be formed of known materials, and examples of the materials include known adhesives and pressure sensitive adhesives.

In addition, the laminate 10B may include a support. Examples of the support include the support described in the first embodiment.

The laminate 10B may include an alignment film. Examples of the alignment film include the alignment film described in the first embodiment.

A method for producing the laminate 10B is not particularly limited, and examples thereof include a method of bonding each of the prepared first optically anisotropic film 12B and second optically anisotropic film 14B via an adhesive or a pressure sensitive adhesive.

Third Embodiment

A third embodiment of the laminate is a laminate including a first optically anisotropic film and a second optically anisotropic film, in which both of the first optically anisotropic film and the second optically anisotropic film have a slow axis in an in-plane direction, a maximum absorbance Y in a wavelength range of 700 to 900 nm in a fast axis direction is larger than a maximum absorbance X in a wavelength range of 700 to 900 nm in a slow axis direction of the first optically anisotropic film are different from each other, and the slow axis of the first optically anisotropic film and the slow axis of the second optically anisotropic film are parallel with each other, the first optically anisotropic film satisfies Requirements 4 and 5 which will be described later, and the second optically anisotropic film satisfies Requirements 8 and 9 which will be described later.

Hereinafter, the third embodiment will be described with reference to the drawings.

Figure 11:
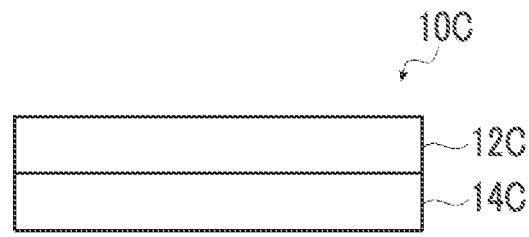
FIG. 11 is a cross-sectional view of a third embodiment of the laminate.
Figure 12:
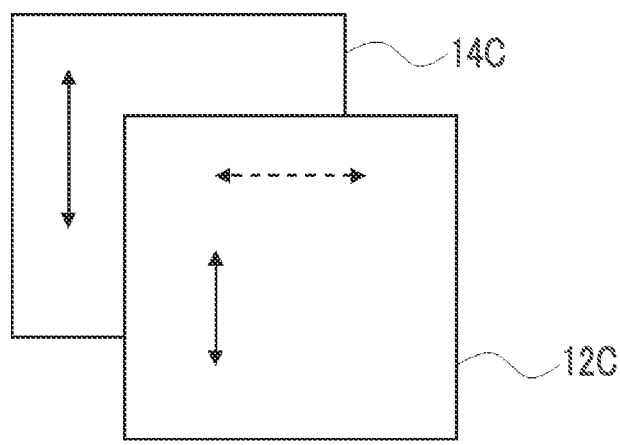
FIG. 12 is a view showing a relationship between a slow axis and an absorption at a wavelength of 700 to 900 nm of an optically anisotropic film in the third embodiment of the laminate.

FIG. 11 is a cross-sectional view of a third embodiment of the laminate. FIG. 12 is a view showing a relationship between a slow axis and an absorption at a wavelength of 700 to 900 nm of an optically anisotropic film in the third embodiment of the laminate.

A laminate 10C includes a first optically anisotropic film 12C and a second optically anisotropic film 14C.

In FIG. 12, the in-plane slow axis of the first optically anisotropic film 12C and the in-plane slow axis of the second optically anisotropic film 14C are each indicated by a solid arrow. As shown in FIG. 12, the slow axis of the first optically anisotropic film 12C and the slow axis of the second optically anisotropic film 14C are parallel with each other.

In the laminate 10C, the maximum absorbance Y in a wavelength range of 700 to 900 nm in the fast axis direction of the first optically anisotropic film 12C is larger than the maximum absorbance X in a wavelength range of 700 to 900 nm in the slow axis direction. That is, in a case of comparison of the maximum absorbances in a wavelength range of 700 to 900 nm in the slow axis direction and the fast axis direction of the first optically anisotropic film 12C, the maximum absorbance in a direction parallel with the fast axis direction of the first optically anisotropic film 12C is larger, as indicated by an arrow of a broken line in FIG. 12.

An expression, "the maximum absorbance Y in a wavelength range of 700 to 900 nm in the fast axis direction of the first optically anisotropic film 12C is larger than the maximum absorbance X in a wavelength range of 700 to 900 nm in the slow axis direction", is intended to mean that the maximum absorbance in a wavelength range of 700 to 900 nm of an absorption spectrum obtained upon irradiation of the first optically anisotropic film 12C with polarized light in parallel with the fast axis of the first optically anisotropic film 12C is larger than the maximum absorbance in a wavelength range of 700 to 900 nm of an absorption spectrum obtained upon irradiation of the first optically anisotropic film 12C with polarized light in parallel with the slow axis of the first optically anisotropic film 12C.

In addition, the measurement can be carried out using a spectrophotometer (MPC-3100 manufactured by SHIMADZU Corporation) equipped with a polarizer for infrared rays.

A total value (Re1(550)+Re2(550)) of the in-plane retardation (Re1(550)) of the first optically anisotropic film 12C at a wavelength of 550 nm and the in-plane retardation (Re2(550)) of the second optically anisotropic film 14C at a wavelength of 550 nm is not particularly limited, but can be appropriately set according to a desired value since the in-plane retardation of the obtained laminate 10C corresponds to the total value, as will be described later.

For example, in a case where the laminate 10C is used as a λ/4 plate, the total value is preferably 110 to 160 nm, and more preferably 120 to 1.50 nm.

The range of Re1(550) is not particularly limited, but is preferably 20 to 200 nm, and more preferably 40 to 100 nm from the viewpoint that the effect of the present invention is more excellent.

The range of Re2(550) is not particularly limited, is preferably 20 to 200 nm, and more preferably 40 to 100 nm from the viewpoint that the effect of the present invention is more excellent.

The first optically anisotropic film 12B satisfies Requirements 4 and 5.

$$\{Re1(450)/Re1(550)\} \geq 0.95 \quad \text{Requirement 4:}$$

$$\{Re1(650)/Re1(550)\} \geq 1.02 \quad \text{Requirement 5:}$$

Re1(450) represents an in-plane retardation of the first optically anisotropic film 12C at a wavelength of 450 nm, Re1(550) represents an in-plane retardation of the first optically anisotropic film 12C at a wavelength of 550 nm, and Re1(650) represents an in-plane retardation of the first optically anisotropic film 12C at a wavelength of 650 nm.

{Re1(450)/Re1(550)} only needs to satisfy Requirement 4, but is preferably 0.97 or more, and more preferably 1.00 or more from the viewpoint that the effect of the present invention is more excellent. An upper limit thereof is not particularly limited, but is preferably 1.20 or less, and more preferably 1.10 or less.

{Re1(650)/Re1(550)} only needs to satisfy Requirement 5, but is preferably 1.03 or more, and more preferably 1.05 or more from the viewpoint that the effect of the present invention is more excellent. An upper limit thereof is not particularly limited, but is preferably 1.30 or less, and more preferably 1.20 or less.

The second optically anisotropic film 14C satisfies Requirements 8 and 9.

$$\{Re2(450)/Re2(550)\} < 0.95 \quad \text{Requirement 8:}$$

$$1.00 < \{Re2(650)/Re2(550)\} < 1.08 \quad \text{Requirement 9:}$$

Re2(450) represents an in-plane retardation of the second optically anisotropic film 14C at a wavelength of 450 nm, Re2(550) represents an in-plane retardation of the second optically anisotropic film 14C at a wavelength of 550 nm, and Re2(650) represents an in-plane retardation of the second optically anisotropic film 14C at a wavelength of 650 nm.

{Re2(450)/Re2(550)} only needs to satisfy Requirement 8, but is preferably 0.93 or less, and more preferably 0.88 or less from the viewpoint that the effect of the present invention is more excellent. A lower limit thereof is not particularly limited, but is preferably 0.50 or more, and more preferably 0.60 or more.

{Re2(650)/Re2(550)} only needs to satisfy Requirement 9, but is preferably 1.02 to 1.07, and more preferably 1.03 to 1.07 from the viewpoint that the effect of the present invention is more excellent.

A reason why a predetermined effect can be obtained by the configuration is shown below.

In the above-mentioned first optically anisotropic film 12C, the maximum absorbance in a wavelength range of 700 to 900 nm in the fast axis direction is larger than the maximum absorbance in a wavelength range of 700 to 900 nm in the slow axis direction.

As described in the second embodiment, in the first optically anisotropic film 12C having the absorption characteristics Y, the in-plane retardation tends to increase in the long wavelength range of the visible region.

Figure 13:
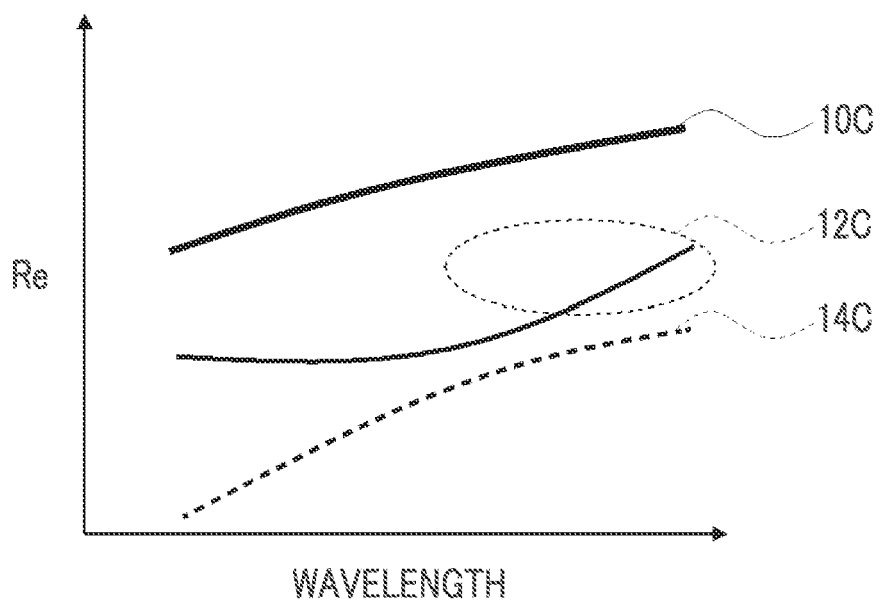
FIG. 13 is a view showing a relationship between an in-plane retardation of a first optically anisotropic film and an in-plane retardation of a second optically anisotropic film, and an in-plane retardation of a laminate.

Next, the relationship between the in-plane retardation of the first optically anisotropic film 12C and the in-plane retardation of the second optically anisotropic film 14C, and the in-plane retardation of the laminate 10C is shown in FIG. 13. The horizontal axis of FIG. 13 shows a wavelength (nm), and the vertical axis shows an in-plane retardation (Re) at each wavelength.

In FIG. 13, a thick line at the top indicates the in-plane retardation of the laminate 10C at each wavelength, a solid line in the middle indicates the in-plane retardation of the first optically anisotropic film 12C at each wavelength, and a broken line at the bottom indicates the in-plane retardation of the second optically anisotropic film 14C at each wavelength.

As mentioned above, in the laminate 10C, the slow axis of the first optically anisotropic film 12C and the slow axis of the second optically anisotropic film 14C are parallel with each other. In a case where the slow axes of the two optically anisotropic films are parallel with each other, the in-plane retardation of the laminate corresponds to a total value of the in-plane retardations of the two optically anisotropic films.

As mentioned above, in the first optically anisotropic film 12C, the in-plane retardation in the long wavelength range increases due to the influence of an absorption at a wavelength of 700 to 900 nm. Specifically, the in-plane retardation in the long wavelength range surrounded by a circle of a broken line in FIG. 13 also decreases. Therefore, a total value of the in-plane retardation of the first optically anisotropic film 12C and the in-plane retardation of the second optically anisotropic film 14C in the long wavelength range increases, and as a result, the in-plane retardation of the laminate 10C in the long wavelength range increases.

As mentioned above, a reverse wavelength dispersible and optically anisotropic film in the related art often tends to deviate from the ideal curve in the long wavelength range.

In contrast, in a case of adopting the configuration of the laminate 10C, the in-plane retardation in the long wavelength range increases, and thus, the optical characteristics in the long wavelength range can be closer to the ideal curve, as indicated by an outlined arrow in FIG. 6.

The specific configurations of the first optically anisotropic film 12C and the second optically anisotropic film 14C will be described in detail later.

Re(450)/Re(550) of the laminate 10C is not particularly limited, but is preferably 0.65 to 0.96 and more preferably 0.75 to 0.93 from the viewpoint that the effect of the present invention is more excellent.

Re(650)/Re(550) of the laminate 10C is not particularly limited, but is preferably 1.07 to 1.25, and more preferably 1.09 to 1.20 from the viewpoint that the effect of the present invention is more excellent.

The laminate 10C may include members other than the first optically anisotropic film 12C and the second optically anisotropic film 14C.

For example, the laminate 10C may include an adhesive layer for ensuring the adhesiveness of the first optically anisotropic film 12C and the second optically anisotropic film 14C. The adhesive layer may be formed of known materials, and examples of the materials include known adhesives and pressure sensitive adhesives.

In addition, the laminate 10C may include a support. Examples of the support include the support described in the first embodiment, The laminate 10C may include an alignment film. Examples of the alignment film include the alignment film described in the first embodiment.

A method for producing the laminate 10C is not particularly limited, and examples thereof include a method of bonding each of the prepared first optically anisotropic film 12C and second optically anisotropic film 14C via an adhesive or a pressure sensitive adhesive.

<First Optically Anisotropic Film>

The material included in the first optically anisotropic film is not particularly limited as long as it satisfies each requirement of the first to third embodiments, but the material preferably includes a polymer (hereinafter also referred to as a "specific polymer") having a residue derived from an infrared absorbing coloring agent (hereinafter simply referred to as an "infrared absorbing coloring agent residue") or an infrared absorbing coloring agent.

The residue derived from an infrared absorbing coloring agent means a group obtained by removing any hydrogen atom from the infrared absorbing coloring agent, and for example, in a case where one hydrogen atom is removed, the residue is a monovalent infrared absorbing coloring agent residue is used, and in a case where two hydrogen atoms are removed, the residue is a divalent infrared absorbing coloring agent residue.

The molecular weight of the specific polymer is not particularly limited, but the weight-average molecular weight is preferably 5,000 or more, and more preferably 10,000 or more. An upper limit thereof is not particularly limited, but is often 1,000,000 or less.

Furthermore, in the present specification, the infrared absorbing coloring agent does not include a compound having a plurality of repeating units. That is, the specific polymer corresponds to a compound different from the infrared absorbing coloring agent (in other words, the specific polymer is not included in the infrared absorbing coloring agent).

Furthermore, in a ease where the first optically anisotropic film includes a specific polymer, the first optically anisotropic film may be formed by using a composition including the specific polymer, or the first optically anisotropic film may also be formed by subjecting a composition including a polymerizable liquid crystal compound and an infrared absorbing coloring agent having a polymerizable group, each of which will be described later, to a curing treatment.

The first optically anisotropic film may include components other than the above-mentioned specific polymer and infrared absorbing coloring agent.

For example, the first optically anisotropic film may include another polymer other than the specific polymer. Examples of the other polymer include known polymers such as a cycloolefin resin, a cellulose acylate resin, a polycarbonate resin, a poly(meth)acryl resin, and a polystyrene resin.

The other polymer may be either a forward wavelength dispersible polymer or a reverse wavelength dispersible polymer. The forward wavelength dispersible polymer means a polymer which can be used to form an optically anisotropic film exhibiting forward wavelength dispersibility. The forward wavelength dispersibility means characteristics that the longer the measurement wavelength, the smaller the in-plane retardation.

The reverse wavelength dispersible polymer means a polymer which is used to form an optically anisotropic film exhibiting reverse wavelength dispersibility. The reverse wavelength dispersibility means characteristics that the longer the measurement wavelength, the larger the in-plane retardation.

(Suitable Aspect 1)

One of suitable aspects of the first optically anisotropic film may be an optically anisotropic film formed using a composition including a liquid crystal compound and an infrared absorbing coloring agent.

Hereinafter, the components included in the composition will be described.

[Infrared Absorbing Coloring Agent]

The infrared absorbing coloring agent is a coloring agent having a maximum absorption wavelength in the infrared region.

The molecular weight of the infrared absorbing coloring agent is not particularly limited, but is preferably less than 5,000. A lower limit thereof is not particularly limited, but is often 500 or more.

Examples of the infrared absorbing coloring agent include diketopyrrolopyrrole-based coloring agents, diimmonium-based coloring agents, phthalocyanine-based coloring agents, naphthalocyanine-based coloring agents, azo-based coloring agents, polymethine-based coloring agents, anthraquinone-based coloring agents, pyrylium-based coloring agents, squarylium-based coloring agents, triphenylmethane-based coloring agents, cyanine-based coloring agents, and aminium-based coloring agents.

The infrared absorbing coloring agents may be used alone or in combination of two or more kinds thereof.

As the infrared absorbing coloring agent, a coloring agent having a maximum absorption wavelength in the near-infrared region (near-infrared absorbing coloring agent) is preferable.

From the viewpoint that the effect of the present invention is more excellent, the maximum absorption wavelength of the infrared absorbing coloring agent is preferably positioned in a wavelength range of 700 to 1,200 nm, and more preferably positioned in a wavelength range of 700 to 900 nm.

From the viewpoint that the effect of the present invention is more excellent, an integrated value of the absorbances in a wavelength range of 700 to 900 nm of the infrared absorbing coloring agent is preferably larger than an integrated value of the absorbances in a wavelength range of 400 to 700 nm of the infrared absorbing coloring agent.

The integrated value of the absorbances is a value obtained by summing the absorbances at the respective wavelengths ranging from X to Y nm.

The measurement can be carried out using a spectrophotometer (MPC-3100 manufactured by SHIMADZU Corporation).

Furthermore, the infrared absorbing coloring agent is preferably a dichroic coloring agent. Further, the dichroic coloring agent refers to a coloring agent having a property that an absorbance in the long axis direction and an absorbance in the short axis direction in the molecule are different from each other.

From the viewpoint that the effect of the present invention is more excellent, it is preferable that the infrared absorbing coloring agent has a mesogenic group. By incorporating the mesogenic group into the infrared absorbing coloring agent, the coloring agent can be easily aligned with a liquid crystal compound which will be described later and predetermined absorption characteristics can be easily controlled.

The mesogenic group is a functional group which is rigid and has alignment. Examples of the structure of the mesogenic group include a structure in which a plurality of groups selected from the group consisting of an aromatic ring group (an aromatic hydrocarbon ring group and an aromatic heterocyclic group) and an alicyclic group are linked directly or via a linking group (which represents, for example, —O—, —CO—, —C(R$^O$)$_2$—, —CH=CH—, —CH=N—, —N=N—, —C≡C—, —NR$^O$—, or a combination thereof (for example, —COO—, —CONR$^O$—, —COOCH$_2$CH$_2$—, —CONRCH$_2$CH$_2$—, —OCOH=CH—, and —C≡C—C≡C—), in which R$^O$ represents a hydrogen atom or an alkyl group having 1 to 6 carbon atoms).

Suitable aspects of the infrared absorbing coloring agent include a compound represented by Formula (1).

The compound represented by Formula (1) has a less absorption in the visible region, and an optically anisotropic film thus obtained is further suppressed from being colored. In addition, since the compound includes a group having a mesogenic group, it is easily aligned together with the liquid crystal compound.

At this time, in a case where R$^{14}$ in Formula (1) is a group having a mesogenic group, the group having a mesogenic group is arranged such that it extends horizontally from a fused ring moiety including a nitrogen atom at the center of the compound, and therefore, the fused ring moiety is easily aligned in a direction perpendicular to the alignment direction of the liquid crystal compound. As a result, an absorption in the near-infrared region (in particular, a wavelength of 700 to 900 nm) derived from the fused ring moiety is easily obtained in a direction (in other words, the fast axis direction) perpendicular to the slow axis of the first optically anisotropic film.

In addition, in a case where R$^{11}$ in Formula (1) is a group having a mesogenic group, the fused ring moiety including a nitrogen atom is likely to be arranged in the arrangement direction of the liquid crystal compound. As a result, an absorption in the near-infrared region (in particular, a wavelength of 700 to 900 nm) derived from the fused ring moiety is easily obtained in a direction parallel with the slow axis of the first optically anisotropic film.

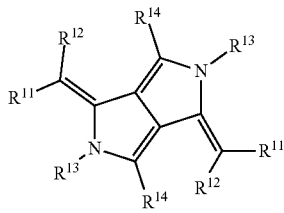

Formula (1)

R$^{11}$ and R$^{12}$ each independently represent a hydrogen atom or a substituent, at least one of R$^{11}$ or R$^{12}$ is an electron-withdrawing group, and R$^{11}$ and R$^{12}$ may be bonded to each other to form a ring. Further, R$^{11}$ may be a group having a mesogenic group, as will be described later.

Examples of the substituent include an alkyl group, an alkenyl group, an alkynyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, an aromatic heterocyclic thio group, a sulfonyl group, a sulfinyl group, a ureide group, a phosphoric acid amide group, a hydroxy group, a mercapto group, a halogen atom, a cyano group, a sulfo group, a carboxyl group, a nitro group, a hydroxamic acid group, a sulfino group, a hydrazino group, an imino group, a heterocyclic group (for example, a heteroaryl group), a silyl group, and a group formed by combination of these groups. Further, the substituent may further be substituted with a substituent.

In addition, examples of the substituent also include a group having a mesogenic group. The group having a mesogenic group will be described in detail later.

The electron-withdrawing group represents a substituent whose a Hammett's sigma para value (σp value) is positive, and examples thereof include a cyano group, an acyl group, an alkyloxycarbonyl group, an aryloxycarhonyl group, a sulfamoyl group, a sulfinyl group, and a heterocyclic group.

These electron-withdrawing groups may further be substituted.

The Hammett's substituent constant σ value will be described. The Hammett rule is an empirical rule proposed by L. P. Hammett in 1935 in order to quantitatively discuss an influence of a substituent exerted on a reaction or equilibrium of a benzene derivative, and nowadays, its validity has been widely recognized. The substituent constants required for the Hammett rule include a σp value and a σm value, and these values are described in many general scientific articles. These are specifically described in, for example, "Lange's Handbook of Chemistry" edited by J. A. Dean., 12$^{th}$ edition, 1979 (McGraw-Hill), "Region of Chemistry", extra edition, No. 122, pp. 96 to 103, 1979 (Nankodo Co., Ltd.), Chem. Rev., 1991, Vol. 91, pp. 165 to 195, and the like. As the electron-withdrawing group in the embodiment of the present invention, a substituent having a Hammett's substituent constant σp value of 0.20 or more is preferable. The σp value is preferably 0.25 or more, more preferably 0.30 or more, and still more preferably 0.35 or more. An upper limit thereof is not particularly limited, but is preferably 0.80 or less.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), and an arylsulfonyl group (—SO$_2$Ph: 0.68), In the present specification, Me represents a methyl group and Ph represents a phenyl group. Further, the values in parentheses are σp values of the representative substituents as extracted from Chem. Rev., 1991, Vol. 91, pp. 165 to 195.

In a case where $R^{11}$ and $R^{12}$ are bonded to form a ring, $R^{11}$ and $R^{12}$ form a 5- to 7-membered ring (preferably a 5- or 6-membered ring), and it is typically preferable to use a ring thus formed as an acidic nucleus in a merocyanine coloring agent.

As the ring formed by the bonding of $R^{11}$ and $R^{12}$, a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imdazolidinedione nucleus, a 2-thio-2,4-imidazolidinedione nucleus, a 2-imidazolin-5-one nucleus, a 3,5-mazolidinedione nucleus, a benzothiophen-3-one nucleus, or an indanone nucleus is preferable.

$R^{11}$ is preferably a heterocyclic group, and more preferably an aromatic heterocyclic group. The heterocyclic group may be either a monocycle or a polycycle. As the heterocyclic group, a pyrazole ring group, a thiazole ring group, an oxazole ring group, an imidazole ring group, an oxadiazole ring group, a thiadiazole ring group, a triazole ring group, a pyridine ring group, a pyridazine ring group, a pyrimidine ring group, a pyrazine ring group, such the benzo-fused ring group (for example, a beazothiazole ring group and a benzopyrazine ring group) or a naphtho-fused ring group, or a composite of these fused rings is preferable.

The heterocyclic group may be substituted with a substituent. Examples of the substituent include the examples of the substituent exemplified as the substituent represented by each of $R^{11}$ and $R^{12}$.

$R^{13}$'s each independently represent a hydrogen atom, an alkyl group, an aryl group, a heteroaryl group, a substituted boron (—B(Ra)$_2$, Ra represents a substituent), or a metal atom, or may be covalently bonded or coordinately bonded with $R^{11}$.

The substituent of the substituted boron represented by $R^{13}$ has the same definition as the above-mentioned substituent for each of $R^{11}$ and $R^{12}$, and is preferably an alkyl group, an aryl group, or a heteroaryl group. The substituent of the substituted boron (for example, the above-mentioned alkyl group, aryl group, or heteroaryl group) may further be substituted with a substituent. Examples of the substituent include the groups exemplified as the substituent represented by each of $R^{11}$ and $R^{12}$.

In addition, the metal atom represented by $R^{13}$ is preferably a transition metal atom, a magnesium atom, an aluminum atom, a calcium atom, a barium atom, a zinc atom, or a tin atom, and more preferably the aluminum atom, the zinc atom, the tin atom, the vanadium atom, the iron atom, the cobalt atom, the nickel atom, the copper atom, the palladium atom, the iridium atom, or the platinum atom.

$R^{14}$'s each independently represent an aryl group, a heteroaryl group, or a group having a mesogenic group. The definition of the mesogenic group is the same as mentioned above.

The group having a mesogenic group is preferably a group represented by Formula (2). * represents a bonding position.

$$*-M^1-(X^1-M^2)_n-X^2-P \quad \text{Formula (2)}$$

$M^1$ represents a substituted or unsubstituted arylene group, or a substituted or unsubstituted heteroarylene group. Examples of the arylene group include a phenylene group. Examples of the heteroamylene group include a divalent group obtained by removing any two hydrogen atoms from a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, such the benzo-fused ring (for example, a benzothiazole ring and a benzopyrazine ring) or a naphtho-fused ring, or a composite of these fused rings. In a case where the arylene group and the heteroarylene group have a substituent, examples of the substituent include the groups exemplified as the substituent represented by each of $R^{11}$ and $R^{12}$.

$X^1$ represents a single bond, —O—, —CO—, —C(R$^0$)$_2$—, —CH=CH—, —CH=N—, —N=N—, —C≡C—, —NR$^0$—, or a combination thereof (for example, —COO—, —CONR$^0$—, —COOCH$_2$CH$_2$—, —CONRCH$_2$CH$_2$—, —OCOCH=CR—, and —C≡C—C≡C—). $R^0$ represents a hydrogen atom or an alkyl group having 1 to 5 carbon atoms.

$M^2$ represents a substituted or unsubstituted arylene group, a substituted or unsubstituted heteroarylene group, or a substituted or unsubstituted cycloalkylene group. Examples of the arylene group include a phenylene group. Examples of the heteroarylene group include a divalent group obtained by removing any two hydrogen atoms from a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, such the benzo-fused ring (for example, a benzothiazole ring and a benzopyrazine ring) or a naphtho-fused ring, or a composite of these fused rings. The number of carbon atoms included in the cycloalkylene group is preferably 5 to 7. In a case where the arylene group, the heteroarylene group, and the cycloalkylene group have a substituent, examples of the substituent include the groups exemplified as the substituent represented by each of $R^{11}$ and $R^{12}$.

$X^2$ represents a single bond or a divalent linking group. Examples of the divalent linking group include a divalent hydrocarbon group (for example, a divalent aliphatic hydrocarbon group such as an alkylene group having 1 to 10 carbon atoms, an alkenylene group having 1 to 10 carbon atoms, and an alkynylene group having 1 to 10 carbon atoms, and a divalent aromatic hydrocarbon group such as an arylene group), a divalent heterocyclic group, —O—, —S—, —NH—, —N(Q)—, —CO—, or a group formed by combination of these groups (for example, —O-divalent hydrocarbon group-, —(O-divalent hydrocarbon group)$_m$—O— (m represents an integer of 1 or more), and -divalent hydrocarbon group-O—CO—). Q represents a hydrogen atom or an alkyl group.

n represents 1 to 10. Among these, n is preferably 1 to 5, and more preferably 2 to 4.

P represents a hydrogen atom or a polymerizable group. The definition of the polymerizable group is the same as that of the polymerizable group that may be contained in a liquid crystal compound which will be described later.

In the compound represented by Formula (2), it is preferable that either $R^{11}$ or $R^{14}$ is a group having a mesogenic group. For example, it is preferable that two $R^{11}$'s are groups having a mesogenic group or two $R^{13}$'s are groups having a mesogenic group.

Each of the groups represented by $R^{11}$ to $R^{14}$ may further have a substituent. For example, the aryl group represented by $R^{14}$ may further have a substituent. Examples of the substituent include the groups exemplified as the substituent represented by each of $R^{11}$ and $R^{12}$.

The infrared absorbing coloring agent is more preferably a compound represented by Formula (3).

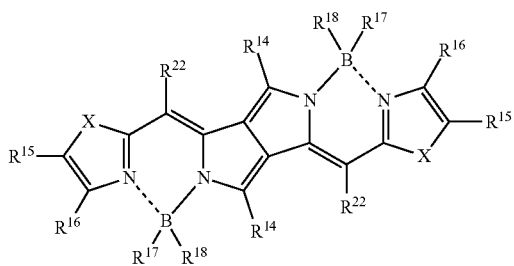

Formula (3)

The definition of $R^{14}$ is the same as mentioned above.

$R^{22}$'s each independently represent a cyano group, an acyl group, an alkoxycarbonyl group, an alkylsulfinyl group, an arylsulfinyl group, or a nitrogen-containing heteroaryl group.

$R^{15}$ and $R^{16}$ each independently represent a hydrogen atom, an alkyl group, an alkoxy group, an aryl group, a heteroaryl group, or the group represent by Formula (4), and $R^{15}$ and $R^{16}$ may be bonded to each other to form a ring. Examples of the ring thus formed include an alicycle having 5 to 10 carbon atoms, an aromatic hydrocarbon ring having 6 to 10 carbon atoms, and an aromatic heterocyclic ring having 3 to 10 carbon atoms. The ring formed by the bonding of $R^{15}$ and $R^{16}$ may further be substituted with a substituent. Examples of the substituent include the groups exemplified in the description of the substituent represented by each of $R^{11}$ and $R^{12}$, and the group represent by Formula (4).

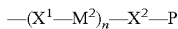  Formula (4)

The definition of each group in Formula (4) is the same as that of each group in Formula (2) mentioned above.

$R^{17}$ and $R^{18}$ each independently represent an alkyl group, an alkoxy group, an aryl group, or a heteroaryl group. The group represented by each of $R^{17}$ and $R^{18}$ may further be substituted with a substituent. Examples of the substituent include the groups exemplified in the description of the substituent represented by each of $R^{11}$ and $R^{12}$.

X's each independently represent an oxygen atom, a sulfur atom, —NR—, —CRR'—, —CH=CH—, or —N=CH—, and R and R' each independently represent a hydrogen atom, an alkyl group, or an aryl group.

Among those, suitable aspects of the compound represented by Formula (3) include an aspect in which $R^{14}$ is a group having a mesogenic group, and an aspect in which $R^{15}$ and $R^{16}$ are bonded to each other form a ring and the group represented by Formula (4) is substituted as a substituent on the ring.

The content of the infrared absorbing coloring agent in the composition is not particularly limited, but from the viewpoint that the effect of the present invention is more excellent, the content is preferably 5% to 70% by mass, and more preferably 10% to 50% by mass with respect to the total mass of the liquid crystal compound.

[Liquid Crystal Compound]

The type of the liquid crystal compound is not particularly limited, but the liquid crystal compounds can be classified into a rod-shaped type (rod-shaped liquid crystal compound) and a disk-shaped type (disk-shaped liquid crystal compound, a discotic liquid crystal compound) based on the shape. Each of the types can further be classified into a low-molecular type and a high-molecular type. The expression, being high-molecular, generally refers to having a degree of polymerization of 100 or more (Polymer Physics-Phase Transition Dynamics, by Masao Doi, page 2, published by Iwanami Shoten, Publishers, 1992). In addition, two or more kinds of the rod-shaped liquid crystal compounds, two or more kinds of the disk-shaped liquid crystal compounds, or a mixture of the rod-shaped liquid crystal compound and the disk-shaped liquid crystal compound may be used.

The position of the maximum absorption wavelength of the liquid crystal compound is not particularly limited, but from the viewpoint that the effect of the present invention is more excellent, it is preferable that the maximum absorption wavelength is positioned in the ultraviolet region.

The liquid crystal compound may be either a forward wavelength dispersible liquid crystal compound or a reverse wavelength dispersible liquid crystal compound.

The forward wavelength dispersible liquid crystal compound means a compound in which the in-plane retardation of an optically anisotropic film formed using the compound decreases as the measurement wavelength increases, The reverse wavelength dispersible liquid crystal compound means a compound in which the in-plane retardation of an optically anisotropic film formed using the compound increases as the measurement wavelength increases.

From the viewpoint that changes in the temperature and the humidity of the optical characteristics can be suppressed, a liquid crystal compound (hereinafter also referred to as a "polymerizable liquid crystal compound") having a polymerizable group is preferable as the liquid crystal compound. The liquid crystal compounds may be a mixture of two or more kinds thereof, and in this case, it is preferable that at least one has two or more polymerizable groups.

That is, it is preferable that the optically anisotropic film is a layer formed by the fixation of a composition including a polymerizable liquid crystal compound by polymerization or the like, and in this case, it is not necessary to exhibit the liquid crystallinity any longer after forming the layer.

The type of the polymerizable group is not particularly limited, and a polymerizable group which is radically polymerizable or cationically polymerizable is preferable.

A known radically polymerizable group can be used as the radically polymerizable group, and an actyloyl group or a methacryloyl group is preferable.

A known canonically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and the epoxy group, the oxetanyl group, or the vinyloxy group is more preferable.

In particular, preferred examples of the polymerizable group include the following groups.

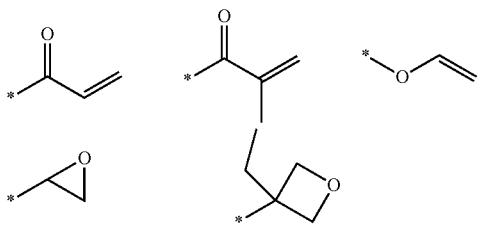

The content of the liquid crystal compound in the composition is not particularly limited, but is preferably 50% by mass or more, and more preferably 70% by mass or more with respect to the total solid content in the composition. An upper limit thereof is not particularly limited, but is often 90% by mass or less.

In addition, the total solid content in the composition does not include a solvent. That is, the solid content means a component obtained by removing the solvent from the composition.

The composition may include components other than the above-mentioned infrared absorbing coloring agent and liquid crystal compound.

The composition may include a polymerization initiator. The polymerization initiator to be used is selected according to the type of a polymerization reaction, and examples thereof include a thermal polymerization initiator and a photopolymerization initiator. Examples of the photopolymerization initiator include an α-carbonyl compound, an acyloin ether, an α-hydrocarbon substituted aromatic acyloin compound, a polynuclear quinone compound, and a combination of a triarylimidazole dimer and a p-aminophenyl ketone.

The content of the polymerization initiator in the composition is preferably 0.01% to 20% by mass, and more preferably 0.5% to 10% by mass with respect to the total solid content of the composition.

In addition, the composition may include a polymerizable monomer.

Examples of the polymerizable monomer include a radically polymerizable or cationically polymerizable compound. Among those, a polyfunctional radically polymerizable monomer is preferable. In addition, as the polymerizable monomer, a monomer which is copolymerizable with the liquid crystal compound having a polymerizable group is preferable. Examples of the polymerizable monomer include those described in paragraphs 0018 to 0020 of JP2002-296423A.

The content of the polymerizable monomer in the composition is preferably 1% to 50% by mass, and more preferably 2% to 30% by mass with respect to the total mass of the liquid crystal compound.

Moreover, the composition may include a surfactant.

Examples of the surfactant include compounds known in the related art, but a fluorine-based compound is preferable. Examples of the compound include the compounds described in paragraphs 0028 to 0056 of JP2001-330725A and the compounds described in paragraphs 0069 to 0126 of JP2003-295212A.

Furthermore, the composition may include a solvent. As the solvent, an organic solvent is preferable. Examples of the organic solvent include an amide (for example, N,N-dimethylformamide), a sulfoxide (for example, dimethyl sulfoxide), a heterocyclic compound (for example, pyridine), a hydrocarbon (for example, benzene and hexane), an alkyl halide (for example, chloroform and dichloromethane), an ester (for example, methyl acetate, ethyl acetate, and butyl acetate), a ketone (for example, acetone and methyl ethyl ketone), and an ether (for example, tetrahydrofuran and 1,2-dimethoxyethane). In addition, two or more kinds of the organic solvents may be used in combination.

Moreover, the composition may include various alignment control agents such as a vertical alignment agent and a horizontal alignment agent. The vertical alignment agent is a compound capable of vertically controlling the alignment of a liquid crystal compound at an interface. The horizontal alignment agent is a compound capable of horizontally controlling the alignment of a liquid crystal compound at an interface.

The composition preferably includes a leveling agent.

The leveling agent is not particularly limited, and is preferably a leveling agent including a fluorine atom (fluorine-based leveling agent) or a leveling agent including a silicon atom (silicon-based leveling agent), and more preferably the fluorine-based leveling agent.

A method for producing the first optically anisotropic film using the composition is not particularly limited, and examples thereof include known methods.

Among those, from the viewpoint that the retardation is easily controlled, a method in which a composition including a polymerizable liquid crystal compound and an infrared absorbing coloring agent is applied to form a coating film, the coating film is subjected to an alignment treatment to align the polymerizable liquid crystal compound (horizontal alignment), and the obtained coating film is subjected to a curing treatment (irradiation with ultraviolet rays (light irradiation treatment) or a heating treatment) to form a first optically anisotropic film is preferable.

That is, the first optically anisotropic film is preferably a film formed by fixing the liquid crystal compound (in particular, a polymerizable liquid crystal compound) which has been horizontally aligned.

Hereinafter, the procedure of the method will be described in detail.

First, the composition is applied onto a support to form a coating film and the coating film is subjected to an alignment treatment to align the polymerizable liquid crystal compound.

The composition used includes a polymerizable liquid crystal compound and an infrared absorbing coloring agent. The definitions of the polymerizable liquid crystal compound and the infrared absorbing coloring agent are the same as mentioned above.

The support to be used is a member having a function as a base material for applying a composition thereon. The support may be a temporary support which is peeled after applying the composition and performing curing.

Examples of the support (temporary support) include a plastic substrate and a glass substrate. Examples of a material constituting the plastic substrate include a polyester resin such as polyethylene terephthalate, a polycarbonate resin, a (meth)acryl resin, an epoxy resin, a polyurethane resin, a polyamide resin, a polyolefin resin, a cellulose derivative, a silicone resin, and polyvinyl alcohol.

The thickness of the support only needs to be about 5 to 1,000 μm, and is preferably 10 to 250 μm, and more preferably 15 to 90 μm.

Moreover, an alignment layer may be arranged on the support, as desired. Examples of the alignment film include the alignment film described in the first embodiment.

Examples of a method for applying the composition include a curtain coating method, a dip coating method, a spin coating method, a printing coating method, a spray coating method, a slot coating method, a roll coating method, a slide coating method, a blade coating method, a gravure coating method, and a wire bar method. A single layer coating is preferable in a case of performing coating by any of these methods.

The coating film formed on the support is subjected to an alignment treatment to align the polymerizable liquid crystal compound and the infrared absorbing coloring agent in the coating film. The infrared absorbing coloring agent also tends to be aligned in a predetermined direction according to the alignment of the polymerizable liquid crystal compound.

The alignment treatment can be performed by drying the coating film at room temperature or heating the coating film. In a case of a thermotropic liquid crystal compound, a liquid crystal phase formed with the alignment treatment can generally be transferred by a change in a temperature or pressure. In a case of a lyotropic liquid crystal compound, the liquid crystal phase can also be transferred according to a compositional ratio such as the amount of a solvent.

Furthermore, the condition in a case of heating the coating film is not particularly limited, but the heating temperature is preferably 50° C. to 250° C., and more preferably 60° C. to 230° C., and the heating time is preferably 10 seconds to 10 minutes.

Moreover, before performing a curing treatment (light irradiation treatment) which will be described later, after heating the coating film, the coating film may be cooled, as desired. The cooling temperature is preferably 20° C. to 200° C., and more preferably 30° C. to 150° C., Next, the coating film in which the polymerizable liquid crystal compound has been aligned is subjected to a curing treatment.

A method for the curing treatment to be carried out on the coating film in which the polymerizable liquid crystal compound has been aligned is not particularly limited, and examples thereof include a light irradiation treatment and a heating treatment. Among those, from the viewpoint of manufacturing suitability, the light irradiation treatment is preferable, and an ultraviolet ray-irradiation treatment is more preferable.

An irradiation condition for the light irradiation treatment is not particularly limited, but an irradiation dose of 50 to 1,000 mJ/cm$^2$ is preferable.

In the production method, the arrangement state of the infrared absorbing coloring agent, and the like can be adjusted by adjusting various conditions, and as a result, the optical characteristics of the optically anisotropic film can be adjusted.

(Suitable Aspect 2)

Other suitable aspects of the first optically anisotropic film include a stretched film including a polymer arid an infrared absorbing coloring agent.

Hereinafter, the components included in the film will be described.

The type of the polymer is not particularly limited, and examples thereof include the polymers exemplified as another polymer mentioned above.

Suitable aspects of the infrared absorbing coloring agent are the same as mentioned above.

The content of the polymer in the stretched film is not particularly limited, but is preferably 50% by mass or more, and more preferably 70% by mass or more with respect to the total mass of the stretched film. An upper limit thereof is not particularly limited, but is often 99% by mass or less.

The content of the infrared absorbing coloring agent in the stretched film is not particularly limited, but is preferably 1% to 40% by mass, and more preferably 3% to 20% by mass with respect to the total mass of the stretched film.

The stretched film may include components other than the polymer and the infrared absorbing coloring agent.

A method for producing the stretched film is not particularly limited, but examples thereof include a method in which an unstretched film is formed using a composition including a polymer and an infrared absorbing coloring agent, and the obtained unstretched film is stretch-aligned to form an optically anisotropic film which is a stretched film.

Examples of the method for forming an unstretched film include a method in which a composition including a polymer, an infrared absorbing coloring agent, and a solvent is applied, and then the solvent is removed to form an unstretched film, and a method in which a solid content including a polymer and an infrared absorbing coloring agent is molten without using a solvent to prepare a film.

Examples of the stretching method include known methods such as longitudinal uniaxial stretching, horizontal uniaxial stretching, or a combination thereof such as simultaneous biaxial stretching or sequential biaxial stretching.

(Suitable Aspect 3)

Other suitable aspects of the first optically anisotropic film include a stretched film including a specific polymer.

Hereinafter, the components included in the film will be described.

The specific polymer is not particularly limited as long as it has an infrared absorbing coloring agent residue, but the specific polymer preferably includes a repeating unit having an infrared absorbing coloring agent residue.

The infrared absorbing coloring agent capable of forming an infrared absorbing coloring agent residue only needs to be a coloring agent having a maximum absorption wavelength in the infrared region, and examples thereof include the infrared absorbing coloring agents described in (Suitable Aspect 1) above.

The infrared absorbing coloring agent residue may be arranged in the main chain moiety or a side chain moiety in the specific polymer.

The stretched film may include other components other than the specific polymer. Examples of such other components include the above-mentioned other polymers, A method for producing the stretched film is not particularly limited, but examples thereof include a method in which an unstretched film is formed using a composition including a specific polymer, and the obtained unstretched film is stretch-aligned to form an optically anisotropic film which is a stretched film.

Examples of the method for forming an unstretched film include a method in which a composition including a specific polymer and a solvent is applied, and then the solvent is removed to form an unstretched film, and a method in which solid contents including a specific polymer are molten without using a solvent to prepare a film.

Examples of the stretching method include known methods such as longitudinal uniaxial stretching, horizontal uniaxial stretching, or a combination thereof such as simultaneous biaxial stretching or sequential biaxial stretching.

The thickness of the first optically anisotropic film is not particularly limited, but is preferably 10 μm or less, more preferably 0.5 to 8.0 μm, and still more preferably 0.5 to 6.0 μm from the viewpoint of reducing the thickness.

In addition, in the present specification, the thickness of the optically anisotropic film is intended to mean an average thickness of the optically anisotropic film. The average thickness is determined by measuring the thickness at any five or more points of the optically anisotropic film and obtaining an arithmetic mean of the values.

<Second Optically Anisotropic Film>

A material included in the second optically anisotropic film is not particularly limited as long as it satisfies each of the requirements of the first embodiment to the third embodiment.

For example, an optically anisotropic film formed by using a composition including a liquid crystal compound can be mentioned.

Examples of the liquid crystal compound include a liquid crystal compound used for forming the first optically anisotropic film.

A stretched film may be used as the second optically anisotropic film. Examples of the polymer included in the stretched film include the other polymer mentioned above.

The thickness of the second optically anisotropic film is not particularly limited, but is preferably 10 μm or less, more preferably 0.5 to 8.0 μm, and still more preferably 0.5 to 6.0 μm from the viewpoint of reducing the thickness.

<Suitable Aspects of Optically Anisotropic Film>

One of suitable aspects of the optically anisotropic film may be an optically anisotropic film satisfying Requirement 10 (hereinafter also referred to as a "specific film 1"), in which a maximum absorbance in a wavelength range of 700 to 900 nm in a fast axis direction of the optically anisotropic film is larger than a maximum absorbance in a wavelength range of 700 to 900 nm in a slow axis direction of the optically anisotropic film.

$$\{Re(450)/Re(550)\} \geq 1.00 \quad \text{Requirement 10:}$$

Re(450) represents an in-plane retardation of the specific film 1 at a wavelength of 450 nm and Re(550) represents an in-plane retardation of the specific film 1 at a wavelength of 550 nm.

$\{Re(450)/Re(550)\}$ of the specific film 1 only needs to satisfy Requirement 10, and is preferably 1.01 or more from the viewpoint that the effect of the present invention is more excellent. An upper limit thereof is not particularly limited, but is preferably 1.40 or less, and more preferably 1.30 or less.

Examples of the material constituting the specific film 1 include the materials described in the above-mentioned first optically anisotropic film and second optically anisotropic film.

The in-plane retardation of the specific film 1 at a wavelength of 550 nm is not particularly limited, but is preferably 20 to 500 nm, more preferably 40 to 400 nm.

$\{Re(650)/Re(550)\}$ of the specific film 1 is not particularly limited, but is preferably 1.02 to 1.30, and more preferably 1.03 to 1.20 from the viewpoint that the effect of the present invention is more excellent.

Other suitable aspects of the optically anisotropic film include an optically anisotropic film satisfying Requirement 11 (hereinafter also referred to as a "specific film 2"), in which a maximum absorbance in a wavelength range of 700 to 900 nm in a fast axis direction of the optically anisotropic film is smaller than a maximum absorbance in a wavelength range of 700 to 900 nm in a slow axis direction of the optically anisotropic film.

$$Re(450)/Re(550) \geq 1.00 \quad \text{Requirement 11:}$$

Re(450) represents an in-plane retardation of the specific film 2 at a wavelength of 450 mu and Re(550) represents an in-plane retardation of the specific film 2 at a wavelength of 550 nm.

$\{Re(450)/Re(550)\}$, of the specific film 2 only needs to satisfy Requirement 11, and is preferably 1.01 or more, and more preferably 1.03 or more from the viewpoint that the effect of the present invention is more excellent. An upper limit thereof is not particularly limited, but is preferably 1.40 or less, and more preferably 1.30 or less.

Examples of the material constituting the specific film 2 include the materials described in the above-mentioned first optically anisotropic film and second optically anisotropic film.

The in-plane retardation of the specific film 2 at a wavelength of 550 nm is not particularly limited, but is preferably 20 to 500 nm, more preferably 40 to 400 nm.

$\{Re(650)/Re(550)\}$ of the specific film 2 is not particularly limited, but is preferably 0.50 to 0.92, and more preferably 0.60 to 0.85 from the viewpoint that the effect of the present invention is more excellent.

<Uses>

The above-mentioned laminate can be applied to various uses, and it can also be used as, for example, a so-called λ/4 plate or λ/2 plate by adjusting the in-plane retardation of the laminate.

Furthermore, the λ/4 plate is a plate having a function of converting linearly polarized light having a specific wavelength into circularly polarized light (or converting circularly polarized light into linearly polarized light). More specifically, the λ/4 plate is a plate in which an in-plane retardation Re at a predetermined wavelength of λ run is λ/4 (or an odd number of times thereof).

The in-plane retardation (Re(550)) of the λ/4 plate at a wavelength of 550 nm may have an error of about 2.5 nm from an ideal value (137.5 nm) at a center, and is, for example, preferably 110 to 160 nm, and more preferably 120 to 150 nm.

In addition, the λ/2 plate is an optically anisotropic film in which the in-plane retardation Re(λ) at a specific wavelength of λ nm satisfies Re(λ)~λ/2. This formula only needs to be satisfied at any wavelength (for example, 550 nm) in the visible region. Above all, it is preferable that the in-plane retardation Re(550) at a wavelength of 550 nm satisfies the following relationship.

$$210 \text{ nm} \leq Re(550) \leq 300 \text{ nm}$$

A laminate and an optical film including the laminate may be included in a display device. That is, examples of more specific uses of the stretched film include an optical compensation film for optical compensation of a liquid crystal cell, and an antireflection film for use in a display device such as an organic electroluminescence display device.

Among those, preferred aspects of the optical film include a circularly polarizing plate including a laminate and a polarizer. This circularly polarizing plate can be suitably used as the antireflection film. That is, it is possible to further suppress a reflection tint in a display device including a display element (for example, an organic electroluminescence display element) and a circularly polarizing plate arranged on the display element.

In addition, the laminate is suitably used in an optical compensation film of an in plane switching (IPS) type liquid crystal display device, and can improve a tint change as viewed from a tilt direction and a light leakage upon black display.

Examples of the optical film including the laminate include a circularly polarizing plate including a polarizer and a laminate, as described above.

The polarizer only needs to be a member (linear polarizer) having a function of converting light into specific linearly polarized light, and an absorptive type polarizer can be usually used.

Examples of the absorptive type polarizer include an iodine-based polarizer, a dye-based polarizer using a dichroic dye, and a polyene-based polarizer. The iodine-based polarizer and the dye-based polarizer are classified into a coating type polarizer and a stretching type polarizer, both of which can be applied, but a polarizer which is manufactured by allowing polyvinyl alcohol to adsorb iodine or a dichroic dye and performing stretching is preferable.

A relationship between the absorption axis of the polarizer and the slow axis of the laminate is not particularly limited, but in a case where the laminate is a λ/4 plate and the optical film is used as a circularly polarizing film, an angle formed between the absorption axis of the polarizer and the slow axis of the laminate is preferably 45°±10°.

EXAMPLES

Hereinafter, the features of the present invention will be described in more details with reference to Examples and Comparative Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to specific examples shown below.

(Synthesis of Coloring Agent IR-1)

A coloring agent IR-1 was synthesized according to the following scheme. A pyrrolopyrrole boron complex IR-1a was synthesized according to the method for synthesizing a compound A-15 described in paragraphs 0271 and 0272 of WO2017/146092A.

In addition, a compound yy-yy was synthesized according to the scheme for a compound P1-1 described in paragraphs 0088 to 0091 of WO2018/124198A.

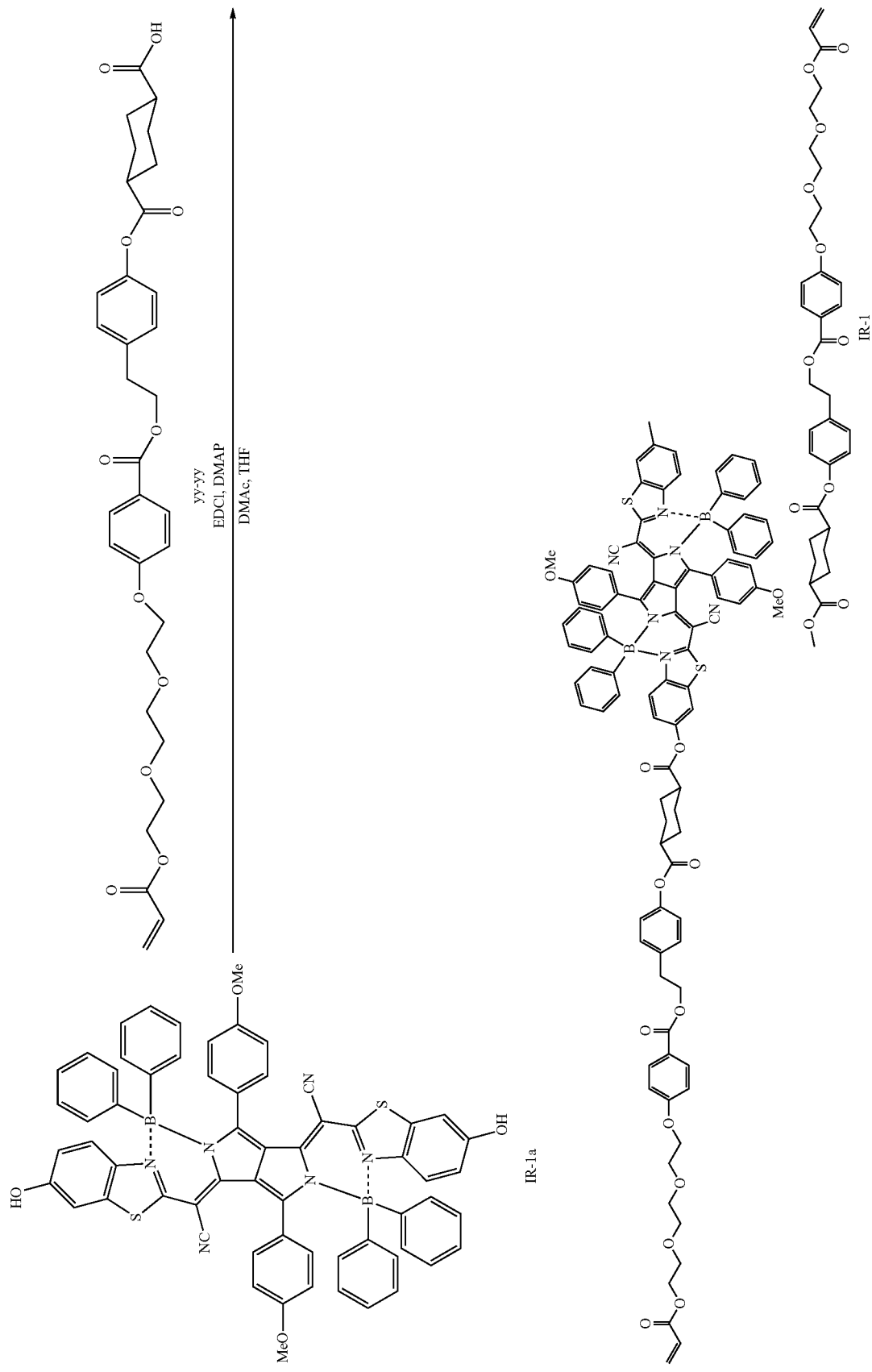

(Synthesis of Coloring Agent IR-2)
A coloring agent IR-2 was synthesized with reference to JP2011-68731A.
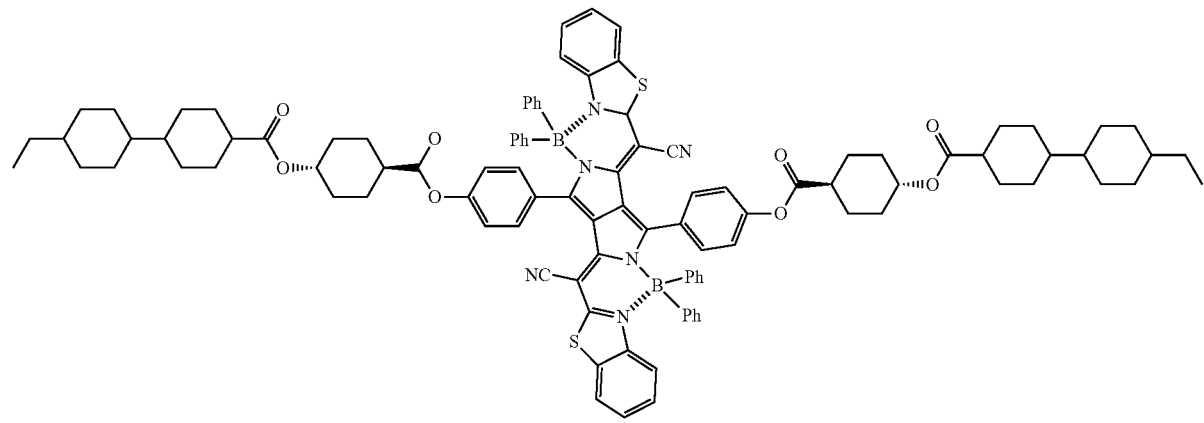
IR-2
(Synthesis of Coloring Agent IR-3)
A coloring agent IR-3 was synthesized according to the following scheme.
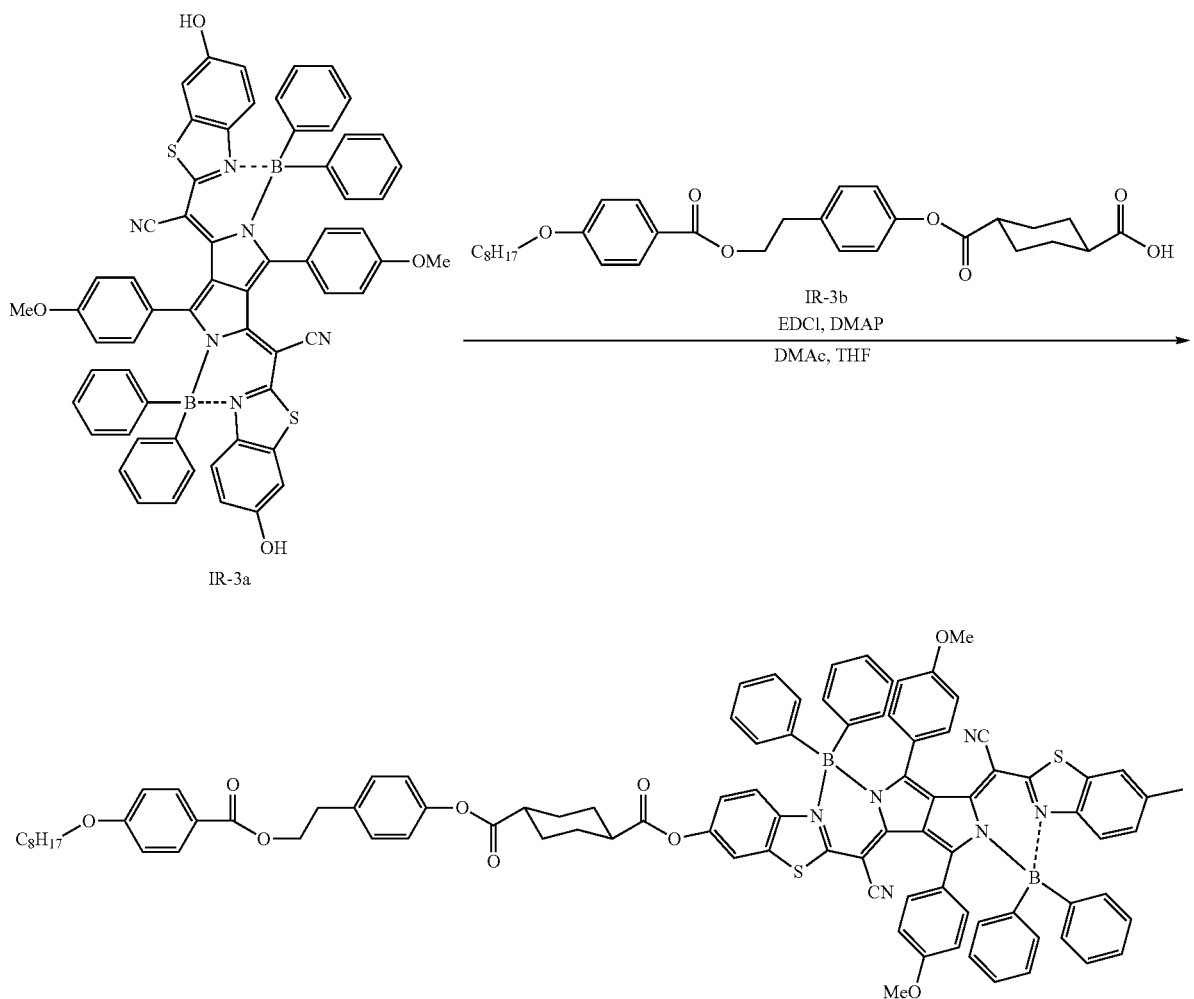

-continued

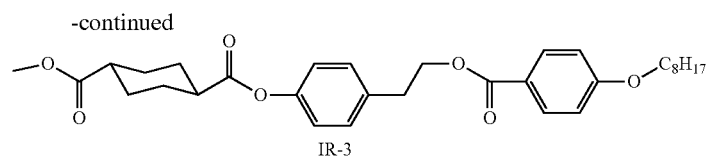

IR-3

Example 1

(Manufacture of Optically Anisotropic Film A)

The following components were mixed, then charged into a glass separable flask equipped with a stirrer, and stirred at room temperature for 24 hours. Thereafter, the obtained mixture was filtered through a polypropylene-made depth filter having a pore diameter of 20 μm to obtain a dope having a concentration of solid contents of 25% by mass.

[Composition of Dope]

| | |
|---|---|
| ARTON G7810 (cyclic olefin-based resin) | 100 parts by mass |
| NX90S (matting agent, manufactured by Nippon Aerosil Co., Ltd.) | 0.08 parts by mass |
| Methylene chloride | 300.36 parts by mass |

The dope was cast onto a metal support through a casting die to form a cast film.

Next, after drying the cast film on the metal support with a drying air at 40° C., the cast film was peeled from the metal support and dried for 20 minutes with a drying air of 140° C. while fixing both ends of the peeled cast film with clips and keeping an interval provided therebetween constant. While keeping the both ends of the cast film with clips, the film was stretched in a transport direction, using a tenter, so that the stretching ratio reached 50%. Further, longitudinal uniaxial stretching was performed as the stretching under the conditions of an air supply temperature of 180° C., a film surface temperature of the cast film of 170° C., and a stretching rate of 60%/min to manufacture an optically anisotropic film A. Re(550) of the obtained optically anisotropic film A was 210 nm. The optically anisotropic film A corresponds to the above-mentioned second optically anisotropic film.

(Manufacture of Optically Anisotropic B)

A cellulose acylate film (TD40UL, manufactured by FUJIFILM Corporation) was allowed to pass through a dielectric heating roll at a temperature of 60° C., the film surface temperature was elevated up to 40° C., then an alkali solution having the composition shown in Table 1 below was applied onto one surface of the film at an application amount of 14 ml/m² with a bar coater and heated at 110° C.

Next, the obtained film was transported for 10 seconds under a steam type far-infrared heater manufactured by NORITAKE Co., Ltd.

Next, pure water was applied onto the obtained film at 3 ml/m² using the same bar coater.

Subsequently, the obtained film was three times repeatedly subjected to washing with water using a fountain coater and dehydration using an air knife, then transported to a drying zone at 70° C. for 10 seconds, and dried to manufacture an alkali saponification-treated cellulose acylate film.

TABLE 1

Composition of alkali solution

| | |
|---|---|
| Potassium hydroxide | 4.7 parts by mass |
| Water | 15.8 parts by mass |
| Isopropanol | 63.7 parts by mass |
| Surfactant ($C_{14}H_{29}O(CH_2CH_2O)_{20}H$) | 1.0 part by mass |
| Propylene glycol | 14.8 parts by mass |

An alignment layer coating liquid having the composition shown in Table 2 below was continuously applied onto a long cellulose acetate film which had been subjected to an alkali saponification treatment, with a wire bar of #14. After applying the alignment layer coating liquid, the alignment layer coating liquid was dried with warm air at 60° C. for 60 seconds and further warmed with warm air at 100° C. for 120 seconds. Further, in the composition below, "Polymerization initiator (IN1)" represents a photopolymerization initiator (IRGACURE 2959, manufactured by BASF).

Subsequently, the coating film after the drying was continuously subjected to a rubbing treatment to form an alignment layer. At this time, the longitudinal direction of the long film and the transporting direction were set to be in parallel with each other, and a rotating shaft of a rubbing roller relative to the longitudinal direction of the film was set to a direction of 0° clockwise.

TABLE 2

Composition of alignment layer coating liquid

| | |
|---|---|
| The following modified polyvinyl alcohol | 10.0 parts by mass |
| Water | 371.0 parts by mass |
| Methanol | 119.0 parts by mass |
| Glutaraldehyde | 0.5 parts by mass |
| Polymerization initiator (IN1) | 0.3 parts by mass |

(in the following structural formula, the proportion is a molar ratio)

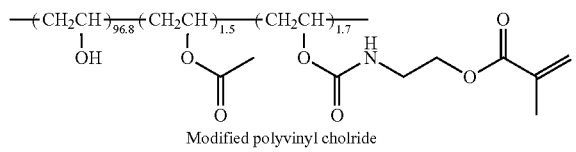

Modified polyvinyl cholride

A rod-shaped liquid crystal compound A (65 parts by mass), a rod-shaped liquid crystal compound B (20 parts by mass), a coloring agent IR-1 (15 parts by mass), a photopolymerization initiator (IRGACURE 907, manufactured by Ciba Geigy, Ltd.) (3 parts by mass), a sensitizer (KAYCURE DETX, manufactured by Nippon Kayaku Co., Ltd.) (1 part by mass), and a horizontal alignment agent A below (0.3 parts by mass) were dissolved in methyl ethyl ketone (193 part by mass) to prepare a solution for forming an optically anisotropic film.

The solution for forming an optically anisotropic film was applied onto the alignment layer with a wire bar coater, and the coating film was heated at 120° C. for 2 minutes. Thereafter, the coating film was cooled to 60° C. and irradiated with ultraviolet rays at an irradiation dose of 300 mJ/cm², using an air-cooled metal halide lamp (manufactured by Eye Graphics Co., Ltd.) at 160 W/cm while performing nitrogen purging so as to create an atmosphere having an oxygen concentration of 1.0% by volume or less to manufacture an optically anisotropic film B. The optically anisotropic film B corresponds to the above-mentioned first optically anisotropic.

Re(550) and Re(450)/Re(550) of the obtained optically anisotropic film B were 70 nm and 1.11, respectively.

Furthermore, absorptions in the infrared region were confirmed using a spectrophotometer (MPC-3100 (manufactured by SHIMADZU Corporation)) equipped with a polarizer for infrared rays, and it was thus confirmed that the absorption in the direction in parallel with the slow axis of the optically anisotropic film B was larger than the absorption in the direction in parallel with the fast axis at a wavelength of 700 to 900 nm.

Example 2

(Optically Anisotropic Film C)

The following components were mixed, then charged into a glass separable flask equipped with a stirrer, and stirred at room temperature for 24 hours. Thereafter, the obtained mixture was filtered through a polypropylene-made depth filter having a pore diameter of 20 μm to obtain a dope having a concentration of solid contents of 25% by mass.

| [Composition of Dope] | |
| --- | --- |
| ARTON G7810 (cyclic olefin-based resin) | 100 parts by mass |
| Coloring agent IR-2 | 2.0 parts by mass |
| NX90S (matting agent, manufactured by Nippon Aerosil Co., Ltd.) | 0.08 parts by mass |
| Methylene chloride | 306 parts by mass |

The dope was cast onto a metal support through a casting die to form a cast film.

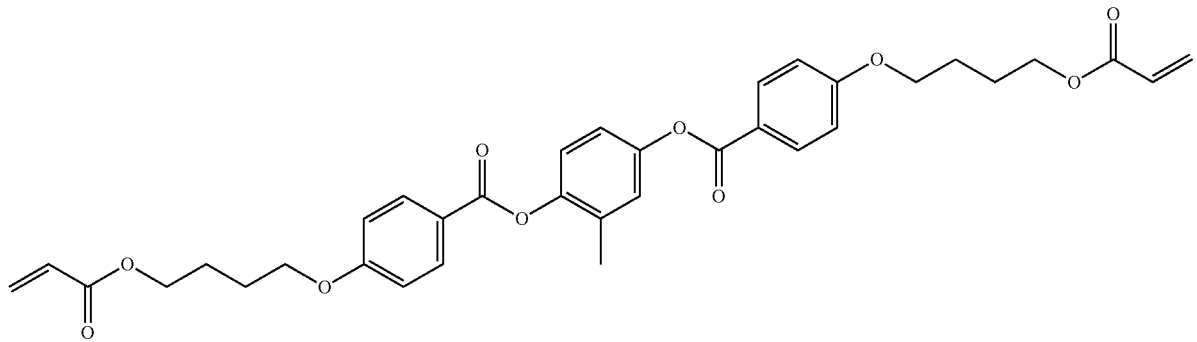

Rod-Shaped liquid crystal compound A

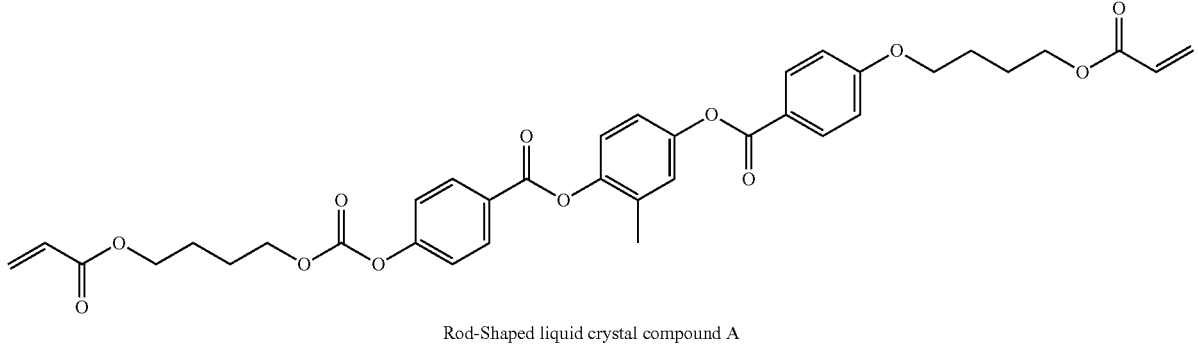

Rod-Shaped liquid crystal compound A

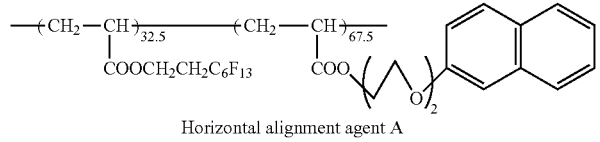

Horizontal alignment agent A (Manufacture of Laminate)

The optically anisotropic film A and the optically anisotropic film B, each manufactured above, were bonded to each other with a pressure sensitive adhesive so that their slow axes were perpendicular to each other to manufacture a laminate.

In a case where the optical characteristics of the obtained laminate were measured, Re(550) was 140 nm, Re(450)/Re (550) was (194, and Re(650)/Re(550) was 1.10.

Next, after drying the cast film on the metal support with a drying air at 40° C., the cast film was peeled from the metal support and dried for 20 minutes with a drying air of 140° C. while fixing both ends of the peeled cast film with clips and keeping an interval provided therebetween constant. While keeping the both ends of the cast film with clips, the film was stretched in a transport direction, using a tenter, so that the stretching ratio reached 50%. Further, longitudinal uniaxial stretching was performed as the stretching under the conditions of an air supply temperature of 180° C., a film surface temperature of the cast film of 170° C., and a stretching rate of 60%/min to manufacture an optically anisotropic film C. Re(550) and Re(450)/Re(550) of the obtained optically anisotropic film C were 240 nm and 1.01, respectively. The optically anisotropic film C corresponds to the above-mentioned first optically anisotropic film.

In addition, an absorption in the infrared region was confirmed using a spectrophotometer (MPC-3100 (manufactured by SHIMADZU Corporation)) equipped with a polarizer for infrared rays, and it was thus confirmed that the absorption in the direction in parallel with the fast axis of the optically anisotropic film C was larger than the absorption in the direction in parallel with the slow axis at a wavelength of 700 to 900 nm.

(Manufacture of Optically Anisotropic Film D)

A rod-shaped liquid crystal compound A (80 parts by mass), a rod-shaped liquid crystal compound B (20 parts by mass), a photopolymerization initiator (IRGACURE 907, manufactured by Ciba Geigy, Ltd.) (3 parts by mass), a sensitizer (KAYACURE DETX, manufactured by Nippon Kayaku Co., Ltd.) (1 part by mass), and a horizontal alignment agent A (0.3 parts by mass) were dissolved in methyl ethyl ketone (193 part by mass) to prepare a solution for forming an optically anisotropic film.

The solution for forming an optically anisotropic film was applied onto the alignment layer manufactured in Example 1 with a wire bar coater, and heated at 60° C. for 2 minutes. Thereafter, the coating film was cooled to 60° C. and irradiated with ultraviolet rays at an irradiation dose of 300 mJ/cm$^2$, using an air-cooled metal halide lamp (manufactured by Eye Graphics Co., Ltd.) at 160 W/cm while performing nitrogen purging so as to create an atmosphere having an oxygen concentration of 1.0% by volume or less to manufacture an optically anisotropic film D. The optically anisotropic film D corresponds to the above-mentioned second optically anisotropic film.

Re(550) of the obtained optically anisotropic film D was 100 nm.

(Manufacture of Laminate)

The optically anisotropic film C and the optically anisotropic film D, each manufactured above, were bonded to each other with an adhesive so that their slow axes were perpendicular to each other to manufacture a laminate.

In a case where the optical characteristics of the obtained laminate were measured, Re(550) was 1.40 nm, Re(450)/Re(550) was 0.93, and Re(650)/Re(550) was 1.12.

Example 3

(Manufacture of Optically Anisotropic Film B)

A solution for forming an optically anisotropic film below was applied onto the alignment layer described in Example 1 with a wire bar to form a coating film, which was heated at 100° C. for 5 minutes. Thereafter, the coating film was cooled to 60° C., nitrogen purge was performed so as to create an atmosphere with an oxygen concentration of 1.0% by volume or less, and the coating film was irradiated with ultraviolet rays at an irradiation dose of 500 mJ/cm$^2$ using a high-pressure mercury lamp to manufacture an optically anisotropic film E. The optically anisotropic film E corresponds to the above-mentioned second optically anisotropic film.

| [Solution for Forming Optically Anisotropic Film] | |
|---|---|
| The following liquid crystalline compound L-1 | 70 parts by mass |
| The following liquid crystalline compound L-2 | 50 parts by mass |
| Photopolymerization initiator 1 (IRGACURE OXE01, manufactured by BASF) | 3.0 parts by mass |
| Photopolymerization initiator 2 (IRGACURE 184, manufactured by BASF) | 3.0 parts by mass |
| The following fluorine-containing compound F-1 | 0.2 parts by mass |
| Cyclopentanone | 227.1 parts by mass |

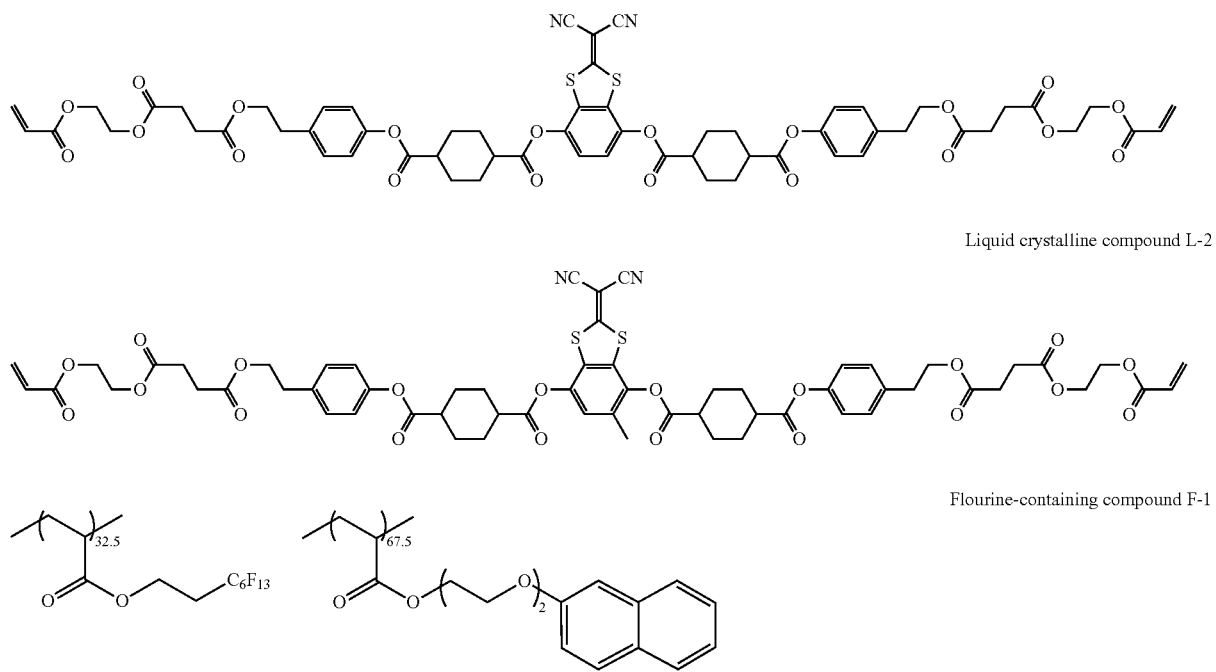

Liquid crystalline compound L-1

Liquid crystalline compound L-2

Flourine-containing compound F-1

In a case where the optical characteristics of the obtained optically anisotropic film F were measured, Re(550) was 190 nm.

(Manufacture of Optically Anisotropic Film F)

The following components were mixed, then charged into a glass separable flask equipped with a stirrer, and stirred at room temperature for 24 hours. Thereafter, the obtained mixture was filtered through a polypropylene-made depth filter having a pore diameter of 20 μm to obtain a dope having a concentration of solid contents of 15% by mass.

| [Composition of Dope] | |
|---|---|
| ARTON G7810 (cyclic olefin-based resin) | 1.00 parts by mass |
| Coloring agent IR-3 | 3.0 parts by mass |
| NX90S (matting agent, manufactured by Nippon Aerosil Co., Ltd.) | 0.08 parts by mass |
| Methylene chloride | 584 parts by mass |

The dope was cast onto a metal support through a casting die to form a cast film.

Next, after drying the cast film on the metal support with a drying air at 40° C., the cast film was peeled from the metal support and dried for 20 minutes with a drying air of 140° C. while fixing both ends of the peeled cast film with clips and keeping an interval provided therebetween constant. While keeping the both ends of the cast film with clips, the film was stretched in a transport direction, using a tenter, so that the stretching ratio reached 50%. Further, longitudinal uniaxial stretching was performed as the stretching under the conditions of an air supply temperature of 180° C., a film surface temperature of the cast film of 170° C., and a stretching rate of 60%/min to manufacture an optically anisotropic film F. Re(550) and Re(450)/Re(550) of the obtained optically anisotropic film F were 50 nm and 1.01, respectively. The optically anisotropic film F corresponds to the above-mentioned first optically anisotropic film.

Furthermore, absorptions in the infrared region were confirmed using a spectrophotometer (MPC-3100 (manufactured by SHIMADZU Corporation)) equipped with a polarizer for infrared rays, and it was thus confirmed that the absorption in the direction in parallel with the slow axis of the optically anisotropic film was larger than the absorption in the direction in parallel with the fast axis at a wavelength of 700 to 900 nm.

(Manufacture of Laminate)

The optically anisotropic film F and the optically anisotropic film F, each manufactured above, were bonded to each other with an adhesive so that their slow axes were perpendicular to each other to manufacture a laminate.

In a case where the optical characteristics of the obtained laminate were measured, Re(550) was 140 nm, Re(450)/Re(550) was 0.83, and Re(650)/Re(550) was 1.09.

Example 4

(Manufacture of Optically Anisotropic Film G)

The following components were mixed, then charged into a glass separable flask equipped with a stirrer, and stirred at room temperature for 24 hours. Thereafter, the obtained mixture was filtered through a polypropylene-made depth filter having a pore diameter of 20 μm to obtain a dope having a concentration of solid contents of 15% by mass.

| [Composition of Dope] | |
|---|---|
| ARTON G7810 (cyclic olefin-based resin) | 100 parts by mass |
| Coloring agent IR-2 | 10.0 parts by mass |
| NX90S (matting agent, manufactured by Nippon Aerosil Co., Ltd.) | 0.08 parts by mass |
| Methylene chloride | 618 parts by mass |

The dope was cast onto a metal support through a casting die to form a cast film.

Next, after drying the cast film on the metal support with a drying air at 40° C., the cast film was peeled from the metal support and dried for 20 minutes with a drying air of 140° C. while fixing both ends of the peeled cast film with clips and keeping an interval provided therebetween constant. While keeping the both ends of the cast film with clips, the film was stretched in a transport direction, using a tenter, so that the stretching ratio reached 50%. Further, longitudinal uniaxial stretching was performed as the stretching under the conditions of an air supply temperature of 180° C., a film surface temperature of the cast film of 170° C., and a stretching rate of 60%/min to manufacture an optically anisotropic film C. Re(550) and Re(450)/Re(550) of the obtained optically anisotropic film C were 48 nm and 1.01, respectively. The optically anisotropic film G corresponds to the above-mentioned first optically anisotropic film.

In addition, an absorption in the infrared region was confirmed using a spectrophotometer (MPC-3100 (manufactured by SHIMADZU Corporation)) equipped with a polarizer for infrared rays, and it was thus confirmed that the absorption in the direction in parallel with the fast axis of the optically anisotropic film G was larger than the absorption in the direction in parallel with the slow axis at a wavelength of 700 to 900 nm.

(Manufacture of Optically Anisotropic Film H)

A composition for forming a polyimide alignment film, SE-130 (manufactured by Nissan Chemical Corporation), was applied onto a washed glass substrate by a spin coating method. After the coating film was dried and then calcined at 250° C. for 1 hour, the coating film was subjected to a rubbing treatment to form an alignment layer.

The following composition. A-1 was applied onto the alignment film by a spin coating method. After the coating film formed on the alignment film was heated to 240° C. on a hot plate and then cooled to 200° C., the coating film was irradiated with ultraviolet rays at 500 mJ/cm$^2$ at a wavelength of 365 nm under a nitrogen atmosphere using a high-pressure mercury lamp to fix the alignment of the liquid crystal compound, thereby manufacturing an optically anisotropic film H. The optically anisotropic film H corresponds to the above-mentioned second optically anisotropic film.

| Composition A-1 | |
|---|---|
| Liquid crystal compound L-1 | 50.00 parts by mass |
| Liquid crystal compound L-2 | 50.00 parts by mass |
| Polymerization initiator PI-1 | 0.50 parts by mass |
| Leveling agent T-1 | 0.20 parts by mass |
| Chloroform | 560.00 parts by mass |

Liquid crystal compound L-1

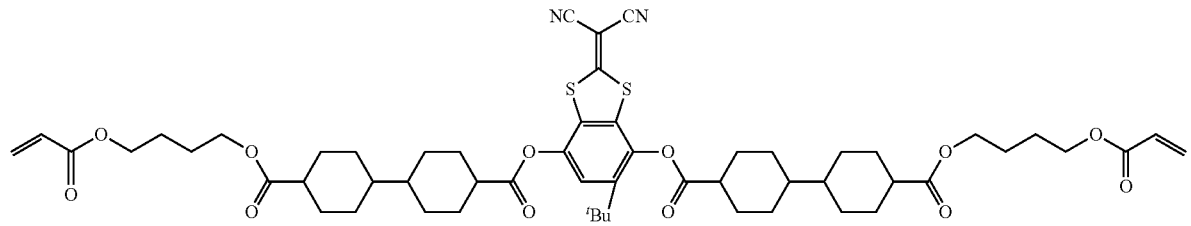 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Liquid crystal compound L-2

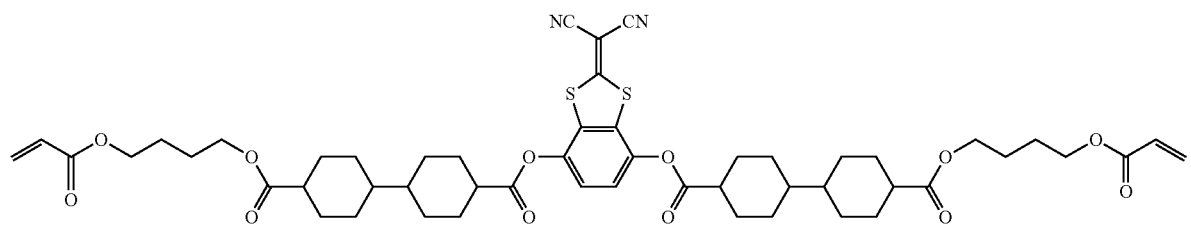 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymerization initiator PI-1

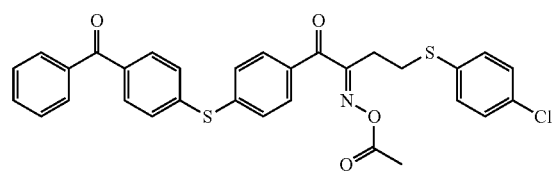 [SMILES: CC(=O)O/N=C(\CCSc1ccc(Cl)cc1)C(=O)c1ccc(Sc2ccc(C(=O)c3ccccc3)cc2)cc1]

Leveling agent T-1

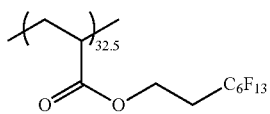

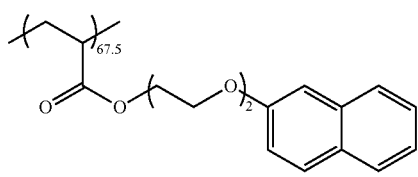

In a case where the optical characteristics of the obtained optically anisotropic film H were measured, Re(550) was 90 nm.

(Manufacture of Laminate)

The optically anisotropic film G and the optically anisotropic film H, each manufactured above, were bonded to each other with an adhesive so that their slow axes were parallel with each other to manufacture a laminate.

In a case where the optical characteristics of the obtained laminate were measured, Re(550) was 138 nm, Re(450)/Re(550) was 0.84, and Re(650)/Re(550) was 1.09.

Comparative Example 1

A laminate was manufactured according to the same procedure as in Example 1, except that the optically anisotropic film I was manufactured according to the same procedure as for the optically anisotropic film B described in Example 1 without using a coloring agent IR-1.

In a case where the optical characteristics of the obtained laminate were measured, Re(550) was 130 nm, Re(450)/Re(550) was 0.95, and Re(650)/Re(550) was 1.02.

In Table: 3, the "Type" columns of the "Optically anisotropic film 1" column and the "Optically anisotropic film 2" column show the types of laminated optically anisotropic films. "A" to "I" indicate an optically anisotropic film A to an optically anisotropic film I, respectively.

The "Coloring agent" column shows coloring agents used. "IR-1" to "IR-3" represent a coloring agent IR-1 to a coloring agent IR-3, respectively.

The "Absorption direction" column shows which absorption is larger, between an absorption in a direction parallel with the slow axis and an absorption in a direction parallel with the fast axis at a wavelength of 700 to 900 nm of the optically anisotropic film. For example, a citation of "Slow axis" indicates which absorption is larger, between an absorption in a direction parallel with the slow axis and an absorption in a direction parallel with the fast axis at a wavelength of 700 to 900 nm of the optically anisotropic film.

The "Slow axis relationship" column shows a relationship between the slow axis of the optically anisotropic film X and the slow axis of the optically anisotropic film Y.

Re(550), Re(450)/Re(550), and Re(650)/Re(550) of the respective optically anisotropic films are summarized in Table 3.

TABLE 3

| | Laminated optically anisotropic film | | | | | | | | | | | | |
|---|---|---|---|---|---|---|---|---|---|---|---|---|---|
| | Optically anisotropic film X | | | | | Optically anisotropic film Y | | | | Laminate | | | |
| | Type | Coloring agent | Absorption direction | Re(550) (nm) | Re(450)/ Re(550) | Re(650)/ Re(550) | Type | Re(550) (nm) | Re(450)/ Re(550) | Re(650)/ Re(550) | Slow axis relationship | Re(550) (nm) | Re(450)/ Re(550) | Re(650)/ Re(550) |
| Example 1 | B | IR-1 | Slow axis | 70 | 1.11 | 0.77 | A | 210 | 1.01 | 0.99 | Perpendicular | 140 | 0.94 | 1.10 |
| Example 2 | C | IR-2 | Fast axis | 240 | 1.01 | 1.05 | D | 100 | 1.11 | 0.95 | Perpendicular | 140 | 0.93 | 1.12 |
| Example 3 | F | IR-3 | Slow axis | 50 | 1.01 | 0.82 | E | 190 | 0.87 | 1.02 | Perpendicular | 140 | 0.83 | 1.09 |
| Example 4 | G | IR-2 | Fast axis | 48 | 1.01 | 1.15 | H | 90 | 0.75 | 1.06 | Parallel | 138 | 0.84 | 1.09 |
| Comparative Example 1 | I | — | — | 80 | 1.11 | 0.95 | A | 210 | 1.01 | 0.99 | Perpendicular | 130 | 0.95 | 1.02 |

As shown in the table, it was confirmed that a desired effect can be obtained with the laminate of the embodiment of the present invention.

A polyvinyl alcohol film having a thickness of 80 μm was dyed by immersing the film in an aqueous iodine solution at an iodine concentration of 0.05% by mass at 30° C. for 60 seconds. Subsequently, the obtained film was vertically stretched five times its original length while the film was immersed in an aqueous boric acid solution (boric acid concentration: 4% by mass) for 60 seconds, and then the vertically stretched film was dried at 50° C. for 4 minutes to obtain a polarizer having a thickness of 20 μm.

A commercially available cellulose acylate-based film "TD80UL" (manufactured by FUJIFILM Corporation) was prepared and immersed in an aqueous sodium hydroxide solution at 1.5 mol/liter at 55° C., and then the obtained film was sufficiently washed with water to remove sodium hydroxide.

Thereafter, the obtained film was immersed in a diluted aqueous sulfuric acid solution at 0.005 mol/liter at 35° C. for one minute, then the obtained film was immersed in water, and the diluted aqueous sulfuric acid solution on the film was sufficiently washed off. Thereafter, the washed film was dried at 120° C. to manufacture a protective film for a polarizer.

The protective film for a polarizer manufactured above was bonded to one surface of the polarizer manufactured above with a polyvinyl alcohol-based adhesive to manufacture a polarizing plate including the polarizer and the protective film for a polarizer arranged on one surface of the polarizer.

A pressure sensitive adhesive (SK-2057, manufactured by Soken Chemical & Engineering Co., Ltd) was applied onto the polarizer (having no protective film for a polarizer) side in the polarizing plate manufactured above to form a pressure sensitive adhesive layer, and the laminate manufactured in Example 1 was bonded thereto such that the pressure sensitive adhesive layer and the optically anisotropic film were adhered to each other, thereby manufacturing a circularly polarizing plate. In addition, an angle formed between the slow axis of the optically anisotropic film and the transmission axis of the polarizer was set to 45°.

Galaxy S4 (manufactured by Samsung) was disintegrated and a part of an antireflection film bonded to the product was peeled and used as a light emitting layer. The circularly polarizing plate manufactured above was bonded to the light emitting layer via a pressure sensitive adhesive while preventing air permeation, thereby manufacturing an organic electroluminescence (EL) display device.

Furthermore, an organic EL display devices were manufactured using the laminates manufactured in Examples 2 and 4, instead of the laminate manufactured in Example 1.

EXPLANATION OF REFERENCES 10A, 10B, 10C laminate
12A, 12B, 12C first optically anisotropic film
14A, 14B, 14C second optically anisotropic film

What is claimed is:

1. A laminate comprising:
   a first optically anisotropic film; and
   a second optically anisotropic film,
   wherein both of the first optically anisotropic film and the second optically anisotropic film have a slow axis in an in-plane direction,
   a maximum absorbance X in a wavelength range of 700 to 900 nm in a slow axis direction and a maximum absorbance Y in a wavelength range of 700 to 900 nm in a fast axis direction of the first optically anisotropic film are different from each other, and
   the slow axis of the first optically anisotropic film and the slow axis of the second optically anisotropic film are parallel with or perpendicular to each other, and
   wherein the maximum absorbance X is larger than the maximum absorbance Y,
   the slow axis of the first optically anisotropic film and the slow axis of the second optically anisotropic film are perpendicular to each other,
   an in-plane retardation of the second optically anisotropic film at a wavelength of 550 nm is larger than an in-plane retardation of the first optically anisotropic film at a wavelength of 550 nm,
   the first optically anisotropic film satisfies Requirement 1, and
   the first optically anisotropic film and the second optically anisotropic film satisfy Requirement 2 and Requirement 3, {Re1(650)/Re1(550)}<0.95   Requirement 1:

{Re1(450)/Re1(550)}>{Re2(450)/Re2(550)}   Requirement 2:

{Re1(650)/Re1(550)}>{Re2(650)/Re2(550)}   Requirement 3:

in the formulae, Re1(450) represents an in-plane retardation of the first optically anisotropic film at a wavelength of 450 nm, Re1(550) represents an in-plane retardation of the first optically anisotropic film at a wavelength of 550 nm, and Re1(650) represents an in-plane retardation of the first optically anisotropic film at a wavelength of 650 nm, and Re2(450) represents an in-plane retardation of the second optically anisotropic film at a wavelength of 450 nm, Re2(550) represents an in-plane retardation of the second optically anisotropic film at a wavelength of 550 nm, and Re2(650) represents an in-plane retardation of the second optically anisotropic film at a wavelength of 650 nm.

2. The laminate according to claim 1,
wherein the first optically anisotropic film includes a polymer having a residue derived from an infrared absorbing coloring agent or an infrared absorbing coloring agent.

3. The laminate according to claim 1,
wherein the first optically anisotropic film is an optically anisotropic film formed of a composition including a liquid crystal compound and an infrared absorbing coloring agent.

4. The laminate according to claim 1,
wherein the first optically anisotropic film is a stretched film including a polymer and an infrared absorbing coloring agent.

5. The laminate according to claim 1,
wherein an in-plane retardation at a wavelength of 550 nm is 110 to 160 nm.

6. A circularly polarizing plate comprising:
the laminate according to claim 5; and
a polarizer.

7. A display device comprising:
a display element; and
the circularly polarizing plate according to claim 6, arranged on the display element.

8. A laminate comprising:
a first optically anisotropic film; and
a second optically anisotropic film,
wherein the first optically anisotropic film has a slow axis in an in-plane direction and the second optically anisotropic film has a slow axis in an in-plane direction,
a maximum absorbance X in a wavelength range of 700 to 900 nm in a slow axis direction and a maximum absorbance Y in a wavelength range of 700 to 900 nm in a fast axis direction of the first optically anisotropic film are different from each other,
the slow axis of the first optically anisotropic film and the slow axis of the second optically anisotropic film are parallel with or perpendicular to each other,
wherein the maximum absorbance Y is larger than the maximum absorbance X,
the slow axis of the first optically anisotropic film and the slow axis of the second optically anisotropic film are perpendicular to each other,
an in-plane retardation of the second optically anisotropic film at a wavelength of 550 nm is smaller than an in-plane retardation of the first optically anisotropic film at a wavelength of 550 nm,
the first optically anisotropic film satisfies Requirements 4 and 5, and
the first optically anisotropic film and the second optically anisotropic film satisfy Requirements 6 and 7, $\{Re1(450)/Re1(550)\} \geq 0.95$  Requirement 4:

$\{Re1(650)/Re1(550)\} \geq 1.02$  Requirement 5:

$\{Re2(450)/Re2(550)\} > \{Re1(450)/Re1(550)\}$, and  Requirement 6:

$\{Re1(650)/Re1(550)\} > 1.00 \geq \{Re2(650)/Re2(550)\}$,  Requirement 7:

in the formulae, Re1 (450) represents an in-plane retardation of the first optically anisotropic film at a wavelength of 450 nm, Re1 (550) represents an in-plane retardation of the first optically anisotropic film at a wavelength of 550 nm, and Re1 (650) represents an in-plane retardation of the first optically anisotropic film at a wavelength of 650 nm, and Re2 (450) represents an in-plane retardation of the second optically anisotropic film at a wavelength of 450 nm, Re2 (550) represents an in-plane retardation of the second optically anisotropic film at a wavelength of 550 nm, and Re2 (650) represents an in-plane retardation of the second optically anisotropic film at a wavelength of 650 nm.

9. The laminate according to claim 8,
wherein the first optically anisotropic film includes a polymer having a residue derived from an infrared absorbing coloring agent or an infrared absorbing coloring agent.

10. The laminate according to claim 8,
wherein the first optically anisotropic film is an optically anisotropic film formed of a composition including a liquid crystal compound and an infrared absorbing coloring agent.

11. A laminate comprising:
a first optically anisotropic film; and
a second optically anisotropic film,
wherein the first optically anisotropic film has a slow axis in an in-plane direction and the second optically anisotropic film has a slow axis in an in-plane direction, a maximum absorbance X in a wavelength range of 700 to 900 nm in a slow axis direction and a maximum absorbance Y in a wavelength range of 700 to 900 nm in a fast axis direction of the first optically anisotropic film are different from each other,
the slow axis of the first optically anisotropic film and the slow axis of the second optically anisotropic film are parallel with or perpendicular to each other,
wherein the maximum absorbance Y is larger than the maximum absorbance X,
the slow axis of the first optically anisotropic film and the slow axis of the second optically anisotropic film are parallel with each other,
the first optically anisotropic film satisfies Requirements 4 and 5, and
the second optically anisotropic film satisfies Requirements 8 and 9, $\{Re1(450)/Re1(550)\} \geq 0.95$  Requirement 4:

$\{Re1(650)/Re1(550)\} \geq 1.02$  Requirement 5:

$\{Re2(450)/Re2(550)\} < 0.95$, and  Requirement 8:

$1.00 < \{Re2(650)/Re2(550)\} < 1.08$,  Requirement 9:

in the formulae, Re1 (450) represents an in-plane retardation of the first optically anisotropic film at a wavelength of 450 nm, Re1 (550) represents an in-plane retardation of the first optically anisotropic film at a wavelength of 550 nm, and Re1 (650) represents an in-plane retardation of the first optically anisotropic film at a wavelength of 650 nm, and Re2 (450) represents an in-plane retardation of the second optically anisotropic film at a wavelength of 450 nm, Re2 (550) represents an in-plane retardation of the second optically anisotropic film at a wavelength of 550 nm, and Re2 (650) represents an in-plane retardation of the second optically anisotropic film at a wavelength of 650 nm.

\* \* \* \* \*